(12) United States Patent
Lee

(10) Patent No.: US 11,538,827 B2
(45) Date of Patent: Dec. 27, 2022

(54) THREE-DIMENSIONAL MEMORY DEVICE WITH INCREASED MEMORY CELL DENSITY

(71) Applicant: MACRONIX International Co., Ltd., Hsinchu (TW)

(72) Inventor: Chih-Hsiung Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/937,340

(22) Filed: Jul. 23, 2020

(65) Prior Publication Data

US 2022/0028882 A1 Jan. 27, 2022

(51) Int. Cl.
*H01L 27/11582* (2017.01)
*H01L 23/522* (2006.01)
*H01L 27/11573* (2017.01)
*H01L 27/1157* (2017.01)

(52) U.S. Cl.
CPC .... *H01L 27/11582* (2013.01); *H01L 23/5226* (2013.01); *H01L 27/1157* (2013.01); *H01L 27/11573* (2013.01)

(58) Field of Classification Search
CPC ......................................... H01L 27/115–11597
See application file for complete search history.

(56) References Cited

U.S. PATENT DOCUMENTS

| 2007/0145464 | A1* | 6/2007 | Voshell | ............... H01L 29/4238 257/314 |
| 2011/0024816 | A1* | 2/2011 | Moon | ................. H01L 29/7926 257/329 |
| 2015/0206587 | A1* | 7/2015 | Hasegawa | ......... H01L 27/11546 257/314 |
| 2016/0049423 | A1 | 2/2016 | Yoo et al. | |
| 2016/0071869 | A1 | 3/2016 | Lee | |
| 2017/0077118 | A1* | 3/2017 | Cheng | ............... H01L 27/11551 |
| 2017/0124330 | A1 | 5/2017 | Van Nieuwenhuyze et al. | |
| 2018/0158834 | A1 | 6/2018 | Ogawa et al. | |
| 2019/0096898 | A1* | 3/2019 | Liu | .................... H01L 27/11582 |
| 2019/0229125 | A1 | 7/2019 | Zhou et al. | |
| 2021/0305273 | A1* | 9/2021 | Lee | ..................... H01L 21/0214 |

FOREIGN PATENT DOCUMENTS

| TW | 201913967 | 4/2019 |
| TW | 201926868 | 7/2019 |
| TW | 202002177 | 1/2020 |
| TW | 202006888 | 2/2020 |
| TW | 202008567 | 2/2020 |
| TW | 202008568 | 2/2020 |

\* cited by examiner

*Primary Examiner* — Didarul A Mazumder
*Assistant Examiner* — Gustavo G Ramallo
(74) *Attorney, Agent, or Firm* — J.C. Patents

(57) ABSTRACT

A memory device and method of forming the same are provided. The memory device includes a word line, a bit line, a source line, a channel pillar, and a charge storage structure. The bit line and the source line are disposed on opposite sides of the word line in a vertical direction. The channel pillar penetrates through and is connected to the word line, the bit line and the source line. The charge storage structure surrounds a top surface and a bottom surface of the word line and is laterally sandwiched between the channel pillar and the word line. The channel pillar completely penetrates through and is laterally surrounded by the bit line.

16 Claims, 23 Drawing Sheets

THREE-DIMENSIONAL MEMORY DEVICE WITH INCREASED MEMORY CELL DENSITY

BACKGROUND

Technical Field

The invention relates to a memory device and a method of forming the same.

Description of Related Art

Along with rapid development of science and technology, advances of electronic components have increased the need for greater storage capacity. In order to meet the need of high storage density, sizes of memory devices become smaller and integration degrees thereof become higher. Therefore, patterns of the memory devices have evolved from a two-dimensional (2D) memory device with planar gate structures to three-dimensional (3D) memory devices with vertical channel (VC) structures. However, the 3D memory devices with the vertical channel structures still have many challenges.

SUMMARY

The embodiments of the disclosure provides a memory device and method of forming the same, which can improve the number of vertically stacked memory cells per unit area, so as to effectively utilize an area of the substrate and increase memory cell density.

The embodiments of the disclosure provide a memory device including a word line, a bit line, a source line, a channel pillar, and a charge storage structure. The bit line and the source line are disposed on opposite sides of the word line in a vertical direction. The channel pillar penetrates through and is connected to the word line, the bit line and the source line. The charge storage structure surrounds a top surface and a bottom surface of the word line and is laterally sandwiched between the channel pillar and the word line. The channel pillar completely penetrates through and is laterally surrounded by the bit line.

The embodiments of the disclosure provide a method of forming a memory device. The method includes the following processes. A stack structure is formed by the following steps: forming a bit line in a dielectric layer, wherein the bit line is extending in a first direction; forming a first sacrificial layer over the dielectric layer; forming a source line over the first sacrificial layer; and forming a second sacrificial layer over the source line. A channel pillar is formed to penetrate through the stack structure, wherein the channel pillar completely penetrates through and is laterally surrounded by the bit line. An insulating layer is formed to penetrate through the stack structure. A first slit hole is formed to penetrate through the stack structure. First portions of the first sacrificial layer and the second sacrificial layer exposed by the first slit hole are removed to form a first gate trench and a second gate trench. A first charge storage structure and a first word line are formed in the first gate trench, and a second charge storage structure and a second word lien are formed in the second gate trench. An insulating material is formed in the first slit hole to form an insulating post.

In the embodiments of the disclosure, the channel pillar is formed after all of the stack structures are formed, and the channel pillar is penetrating through and connected to the word lines, bit lines, and source lines. As such, the fabricating process is simplified, and memory cell density is increased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
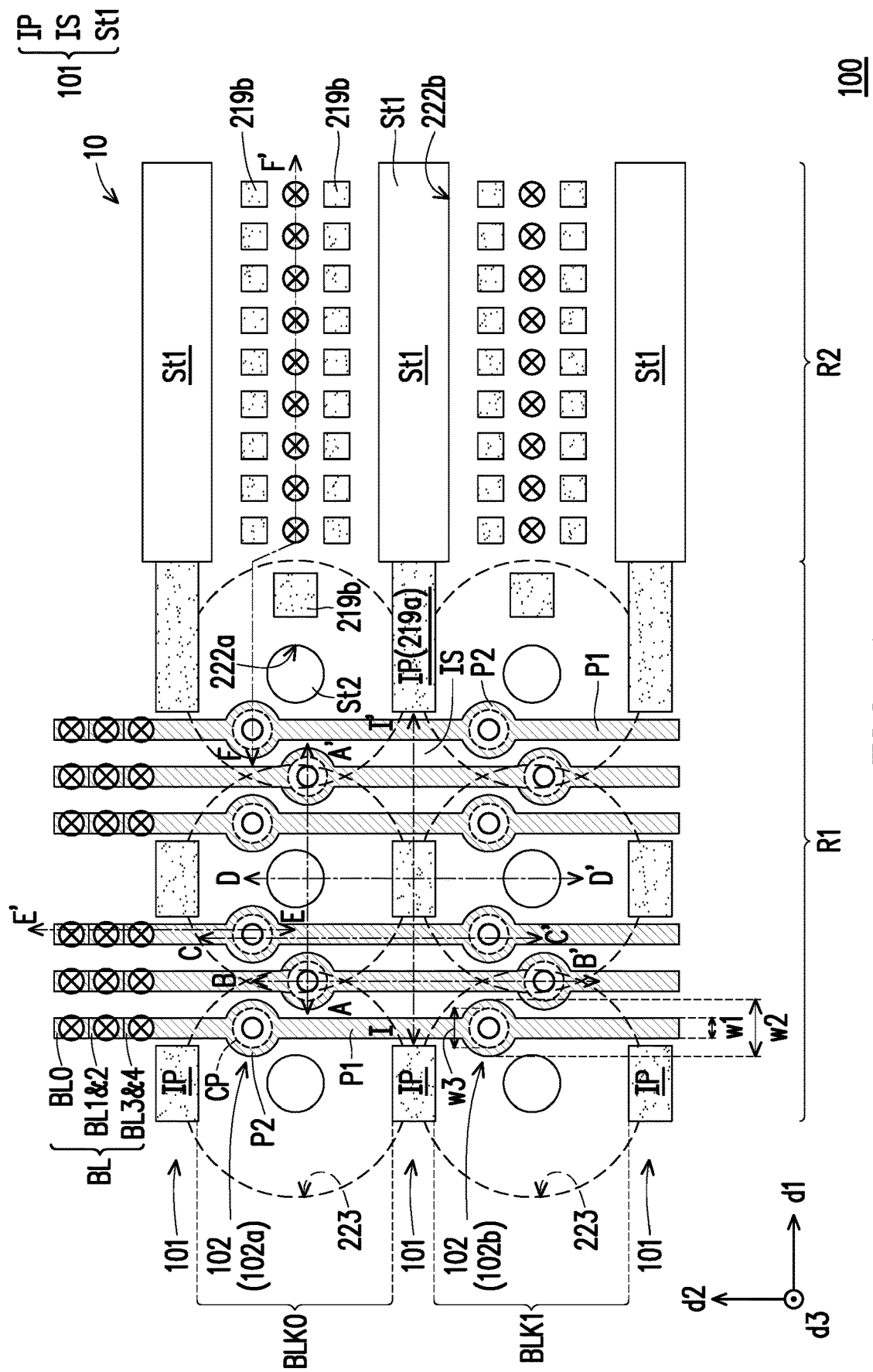
FIG. 1 illustrates a plan view of a memory device according to some embodiments of the disclosure.

The invention will be more fully described with reference to the drawings of the embodiments. However, the invention may be embodied in a variety of different forms and should not be limited to the embodiments described herein. The thickness of layers and regions in the drawings may be exaggerated for clarity. The same or similar component numbers indicate the same or similar components. Accordingly, no further description thereof is provided hereinafter.

Figure 2:
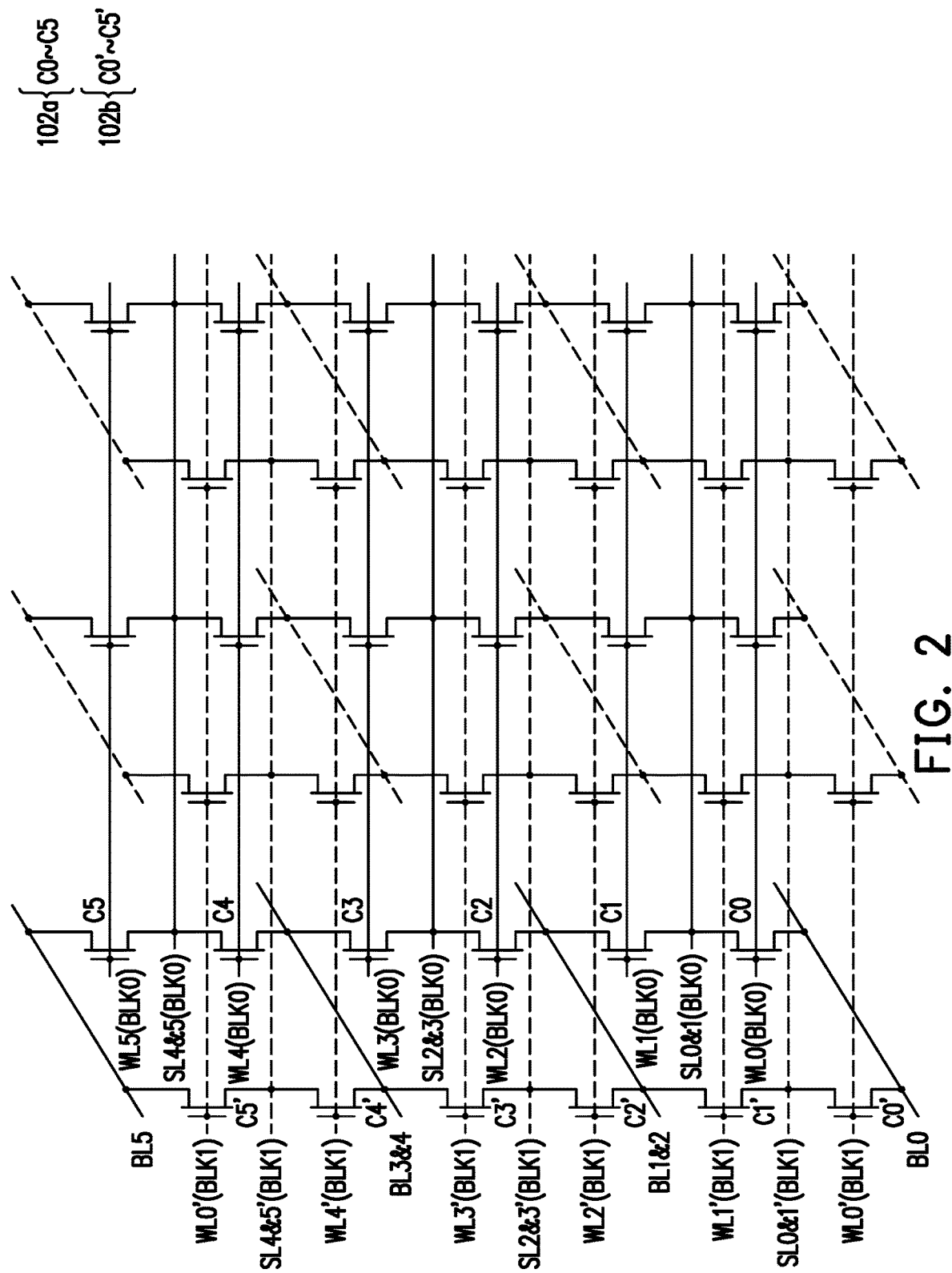
FIG. 2 illustrates a partial equivalent circuit diagram of memory device of FIG. 1 according to some embodiments of the disclosure.

FIG. 1 illustrates a plan view of a memory device according to some embodiments of the disclosure. FIG. 2 illustrates a partial equivalent circuit diagram of memory device of FIG. 1 according to some embodiments of the disclosure. FIG. 3A, FIG. 3B, FIG. 3C, FIG. 3D, FIG. 3E, FIG. 3F illustrate cross-sectional views taken along line A-A', line B-B', line C-C', line D-D', line E-E', line F-F' of FIG. 1, according to some embodiments of the disclosure.

Referring to FIG. 1, a memory device 10 of an embodiment of the disclosure is a three-dimensional (3D) NOR flash memory device, which is disposed on a substrate 100. The memory device 10 may include a plurality of blocks (such as the illustrated blocks BLK0 and BLK1) separated from each other by isolation structures 101 therebetween. In some embodiments, the isolation structure 101 include a plurality of insulating pillars IP, a plurality of insulating structures IS, and an insulating walls St1. In some embodiments, each of the insulating structures IS is located in a region out of the circled regions 223 (The details of the regions 223 will be further described later in the subsequent paragraphs) and boarder/between the insulating pillars IP. In other words, the insulating structure IS is located in a region defined by sidewalls of adjacent insulating pillars IP and portions of outer sidewalls (or edges) of the circled regions 223. The insulting pillars IP, the insulating structures IS and the insulating walls St may be arranged along a direction d1 and connected to each other, so as to constitute a continuous isolation structure between the adjacent two blocks. FIG. 1 shows two blocks BLK0 and BLK1 and three isolation structures 101 separating the two blocks from each other and from other blocks (not shown) for illustration, but the disclosure is not limited thereto. It is appreciated that, the memory device 10 may include any suitable number of blocks and isolation structures.

The memory device 10 includes a first region R1 and a second region R2. The first region R1 may be referred to as a memory region, while the second region R2 may be referred to as a periphery region or a staircase region. In some embodiments, the insulating pillars IP and insulating structures IS are alternatively arranged along the direction d1 within the first region R1, while the insulating wall St1 is disposed bordering the insulating pillar IP and extends along the direction d1 within the second region R2. In alternative embodiments, the insulating wall St may be disposed bordering the insulating structure IS (not shown). Accordingly, the blocks BLK0 and BLK1 within the first region R1 are separated from each other by the insulating pillars IP and insulating structures IS therebetween, while the blocks BLK0 and BLK1 within the second region R2 are separated from each other by the insulting wall St1 therebetween.

In some embodiments, each of the blocks BLK0 and BLK1 includes a plurality of memory cell sets 102 located within the first region R1. For example, the block BLK0 includes a plurality of memory cell sets 102a, and block BLK1 includes a plurality of memory cell sets 102b. In some embodiments, the memory cell sets 102 in each block BLK0/BLK1 may be arranged in a plurality of rows and/or columns. The memory cell sets 102 in two adjacent rows may be staggered with each other, but the disclosure is not limited thereto. Moreover, the memory cell sets 102a in odd-numbered rows of the block BLK0 and the memory cell sets 102b in the odd-numbered rows in the block BLK1 may be aligned with each other in a direction d2. The memory cell sets 102a in even-numbered rows of the block BLK0 and the memory cell sets 102a in even-numbered rows of the block BLK1 may be aligned with each other in the direction d2. However, the disclosure is not limited thereto. The memory cell sets 102 may be disposed in each block in any suitable arrangement, such as an array.

Figure 3A:
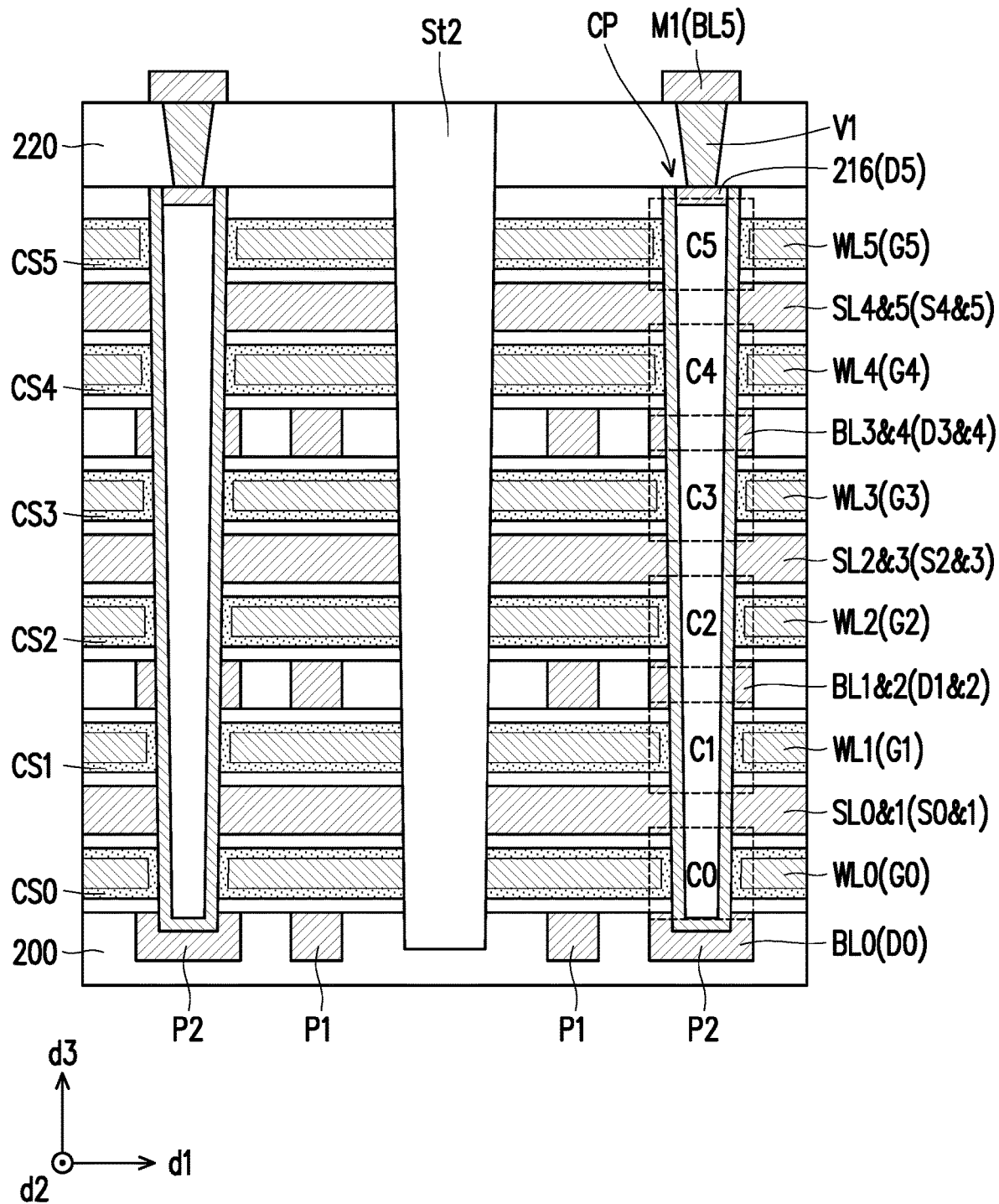
FIG. 3A, FIG. 3B, FIG. 3C, FIG. 3D, FIG. 3E, FIG. 3F illustrate schematic cross-sectional views taken along line A-A', line B-B', line C-C', line D-D', line E-E', line F-F' of FIG. 1.

Referring to FIG. 1, FIG. 2 and FIG. 3A, each of the memory cell sets 102 includes a plurality of memory cells stacked from bottom to top. In the embodiments of the disclosure, each memory cell set 102 may include more than two memory cells, and the number of memory cells included in a memory cell set 102 may range from 2-10, 2-20 or more than 20. For example, each memory cell set 102a in block BLK0 includes memory cells C0, C1, C2, C3, C4, C5 stacked from bottom to top. Similarly, each memory cell set 102b in block BLK1 includes memory cells C0', C1', C2', C3', C4', C5' stacked from bottom to top.

Referring to FIG. 1 and FIG. 2, in some embodiments, the memory device 10 includes a plurality of bit line sets BL arranged parallel in direction d1, and each of the bit line sets BL includes a plurality of bit lines BL0, BL1&2, BL3&4, BL5 from bottom to top, which are extending in the direction d2 and vertically spaced from each other. Each of the bit lines BL0, BL1&2, BL3&4, BL5 may connect drains or common drains of corresponding memory cells in different blocks BLK0 and BLK1 in series. For example, as shown in FIG. 2, the bit line BL0 connects the drain of memory cell C0 in the block BLK0 and the drain of the memory cell C0' in the block BLK1 in series. The bit line BL1&2 connects the common drains of the memory cells C1 and C2 in block BLK0 and the common drains of the memory cells C1' and C2' in block BLK1 in series. The bit line BL3&4 connects the common drains of the memory cells C3 and C4 in block BLK0 and the common drains of the memory cells C3' and C4' in block BLK1 in series. The bit line BL5 connects the drain of the memory cell C5 in block BLK0 and the drain of the memory cell C5' in block BLK1.

Still referring to FIG. 1 and FIG. 2, the memory device 10 further includes a plurality of source lines each of which connect common sources of corresponding memory cells of memory cell sets in a same block. For example, the memory device 10 includes source lines SL0&1, SL2&3, SL4&5 disposed in block BLK0, and source lines SL0&1', SL2&3', SL4&5' disposed in block BLK1. The source line SL0&1 connect the common sources of the memory cells C0 and C1 of corresponding memory cell sets 102a in block BLK0. The source line SL2&3 connect the common sources of the memory cells C2 and C3 of corresponding memory cell sets 102a in block BLK0. The source line SL4&5 connect the common sources of the memory cells C4 and C5 of corresponding memory cell sets 102a in block BLK0. Similarly, the source line SL0&1' connect the common sources of the memory cells C0' and C1' of corresponding memory cell sets 102b in block BLK1. The source line SL2&3' connect the common sources of the memory cells C2' and C3' of corresponding memory cell sets 102b in block BLK1. The source line SL4&5' connect the common sources of the memory cells C4' and C5' of corresponding memory cell sets 102b in block BLK1.

Still referring to FIG. 1 and FIG. 2, the memory device 10 further includes a plurality of word lines each of which connect gates of corresponding memory cells of memory cell sets in a same block. For example, the memory device 10 include word lines WL0, WL1, WL2, WL3, WL4, WL5 disposed in block BLK0, and word lines WL0', WL1', WL2', WL3', WL4', WL5' disposed in block BLK1. The word lines WL0, WL1, WL2, WL3, WL4, WL5 connect gates of the memory cells C0, C1, C2, C3, C4, C5 of memory cell sets 102a in block BLK0, respectively. The word lines WL0', WL1', WL2', WL3', WL4', WL5' connect gates of the memory cells C0', C1', C2', C3', C4', C5' of memory cell sets 102b in block BLK1, respectively.

Referring to FIG. 1 and FIG. 3A which is a cross-sectional view taken along line A-A' of FIG. 1, the memory device 10 includes a plurality of channel pillars CP connected to corresponding word lines, source lines and bit lines, so as to serve as channels of corresponding memory cells. For example, in block BLK0, a channel pillar CP is connected to the word lines WL5-WL0, the source lines SL4&5-SL0&1, and the bit lines BL3&4-BL1&2, serving as channels of the memory cells C0-C5. In some embodiments, the channel pillar CP penetrates through the word lines WL5-WL0, the source lines SL4&5-SL0&1, and the bit lines BL3&4-BL1&2 and may partially penetrate through and embedded in the bit line BL0.

Still referring to FIG. 1 and FIG. 3A, in some embodiments, each of the bit lines BL0, BL1&2, and BL3&4 includes a body portion P1 and protrusions P2 laterally protruding from the sidewalls of the body portion P1. The body portion P1 may have a width W1 in the direction d1, while the protrusion P2 may have a width W2 in the direction d1. The width W2 may be larger than the width W1. Herein, the width of corresponding portion of the bit line refers to the lateral distance between opposite sidewalls in direction d1 which is substantially perpendicular to the extending direction d2 of the bit line, that is, the direction d1 is the widthwise direction of the bit line. Each protrusion P2 is disposed at a position corresponding to one of the channel pillars CP and has a larger dimension (e.g., width, diameter, etc.) than the corresponding channel pillar CP, such that the channel pillar CP penetrating through a bit line can be laterally surrounded by and connected to the protrusion P2 of the bit line. In some embodiments, the width W3 of the channel pillar CP is larger than the width W1 of the body portion P1 and less than the width W2 of the protraction P2. In other words, the channel pillar CP penetrates through the protrusion P2 of corresponding bit line. In some embodiments, both of the channel pillar CP and the protrusion P2 are circular shaped when viewed in a top view or plan view, and the width W3 may refer to the diameter of channel pillar CP, the width W2 may refer to the diameter of protrusion P2.

In the embodiments, the memory cell C0 includes a gate G0 (i.e., the word line WL0), a source S0&1 (i.e., the source line SL0&1), a drain D0 (i.e., the bit line BL0), and a charge storage structure CS0. In some embodiments, the memory cell C0 may also be referred to as a bottommost memory cell of the memory device 10. Accordingly, the word line WL0, the source line SL0&1, and the bit line BL0 may also be referred to as the bottommost word line, bottommost source line, and the bottommost bit line, respectively. The memory cell C1 includes a gate G1 (i.e., the word line WL1), a source S0&1 (i.e., the source line SL0&1), a drain D1&2 (i.e., the bit line BL1&2), and a charge storage structure CS1. The memory cell C2 includes a gate G2 (i.e., the word line WL2), a source S2&3 (i.e., the source line SL2&3), a drain D1&2 (i.e., the bit line BL1&2), and a charge storage structure CS2. The memory cell C3 includes a gate G3 (i.e., the word line WL3), a source S2&3 (i.e., the source line SL2&3), a drain D3&4 (i.e., the bit line BL3&4), and a charge storage structure CS3. The memory cell C4 includes a gate G4 (i.e., the word line WL4), a source S4&5 (i.e., the source line SL4&5), a drain D3&4 (i.e., the bit line BL3&4), and a charge storage structure CS4. In some embodiments, the memory cell C5 is a topmost cell of the memory cell set, and a conductive plug 216 of the channel pillar CP (i.e., a top portion of the channel pillar CP) may be used as a drain D5 of the top memory cell C5. Therefore, the memory cell C5 includes a gate G5 (i.e., the word line WL5), a source S4&5 (i.e., the source line SL4&5), a drain D5 (i.e., the conductive plug 216), and a charge storage structure CS5. The conductive plug 216 may be electrically connected to a conductive line M1 through a conductive via V1. The conductive line M1 may electrically connect the conductive plug 216 (i.e., drain D5 of memory cell C5) of the channel pillar CP in block BLK0 to a conductive plug of a channel pillar CP (i.e., a drain of memory cell C5') in BLK1. Accordingly, the conductive line M1 may also be referred to as a bit line BLS which connects the drain of memory cell C5 in block BLK0 and the drain of memory cell C5' in block BLK1.

In the embodiments, the bit lines, word lines, and source lines are alternatively arranged in a direction d3 perpendicular to a top surface the substrate 100. The bit lines and source lines are vertically disposed on opposite sides of the corresponding word lines, respectively. The source lines are vertically between two word lines. Some of the bit lines are disposed vertically between two word lines, respectively. The bit lines BL0-BL3&4, word lines WL0-WL5, and source lines SL0&1-SL4&5 are continuous layers laterally surrounding and physically contacting the channel pillar CP.

Still referring to FIG. 1 and FIG. 3A, the memory device 10 further includes a plurality of insulating posts St2 in each of the blocks BLK0 and BLK1. The insulating posts St2 are disposed in adjacent regions of memory cells and are formed simultaneously with the insulating walls St1 disposed in the second region R2. In some embodiments, the insulating posts St2 are disposed between insulating pillars IP and overlapped with the insulating pillars IP in the direction d2. It is appreciated that, the insulating posts St2 does not separate the word lines/source lines in a same block. In other words, the word lines/source lines in a same block are continuous layers.

Figure 3B:
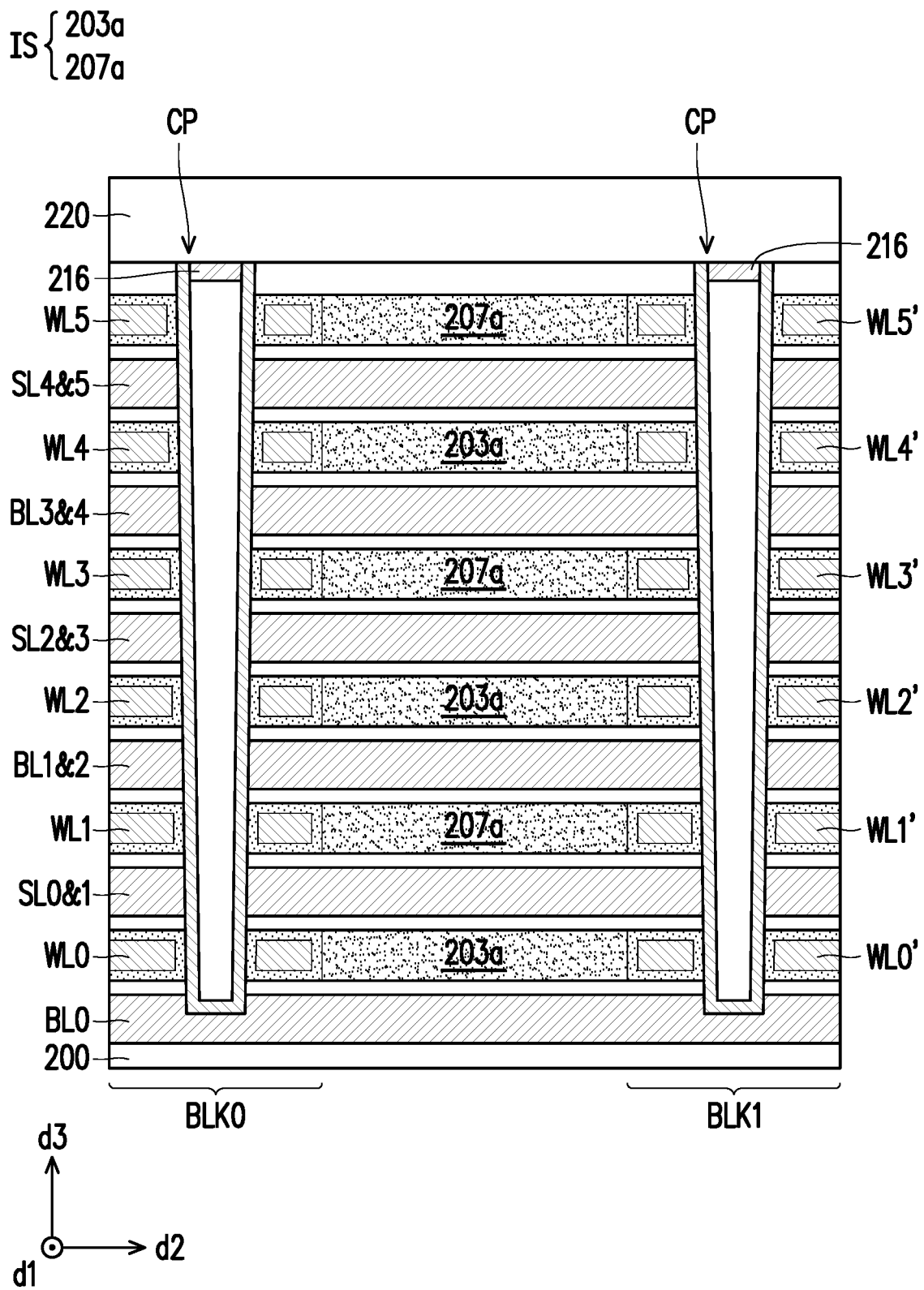
Figure 3C:
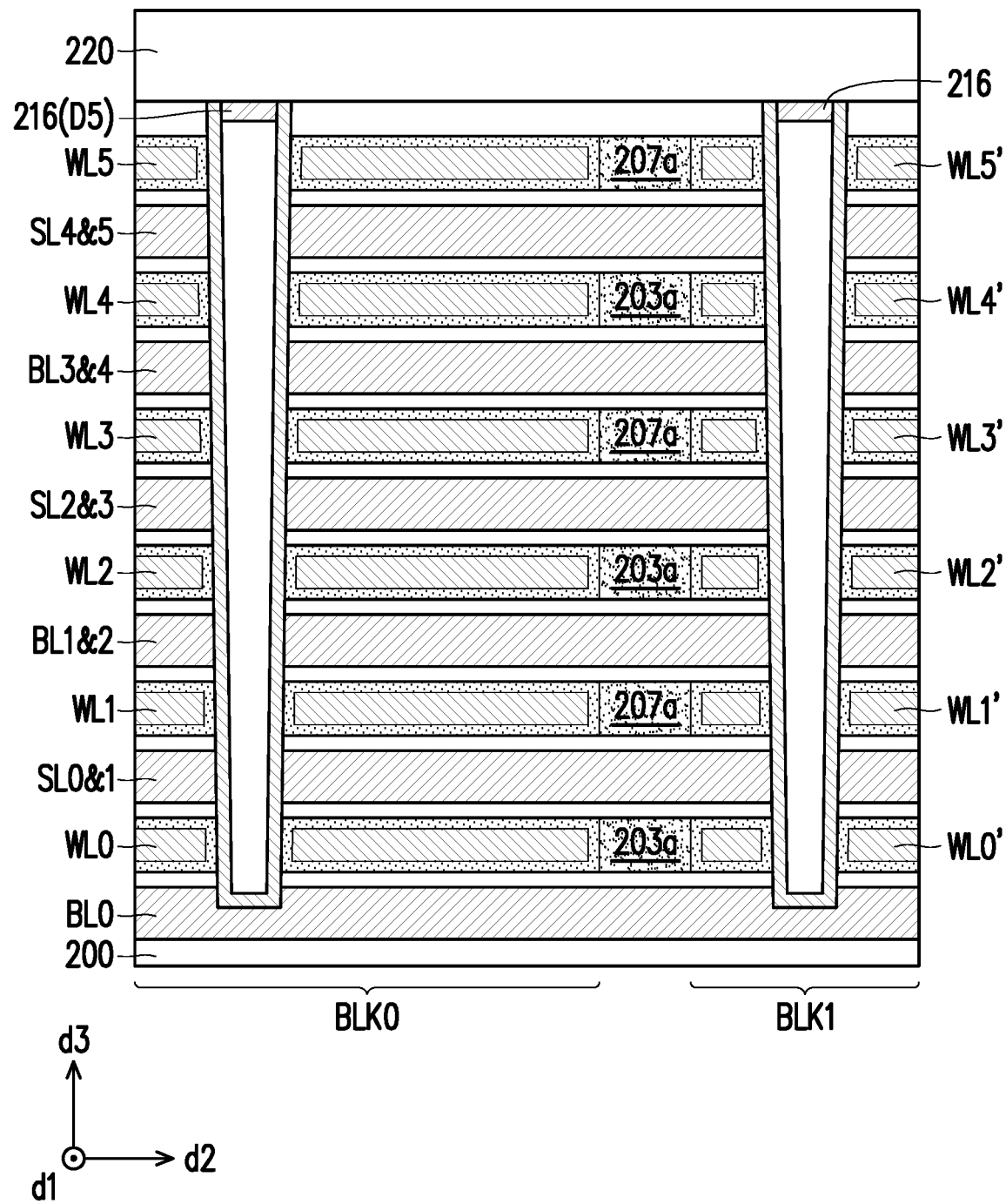
Figure 3D:
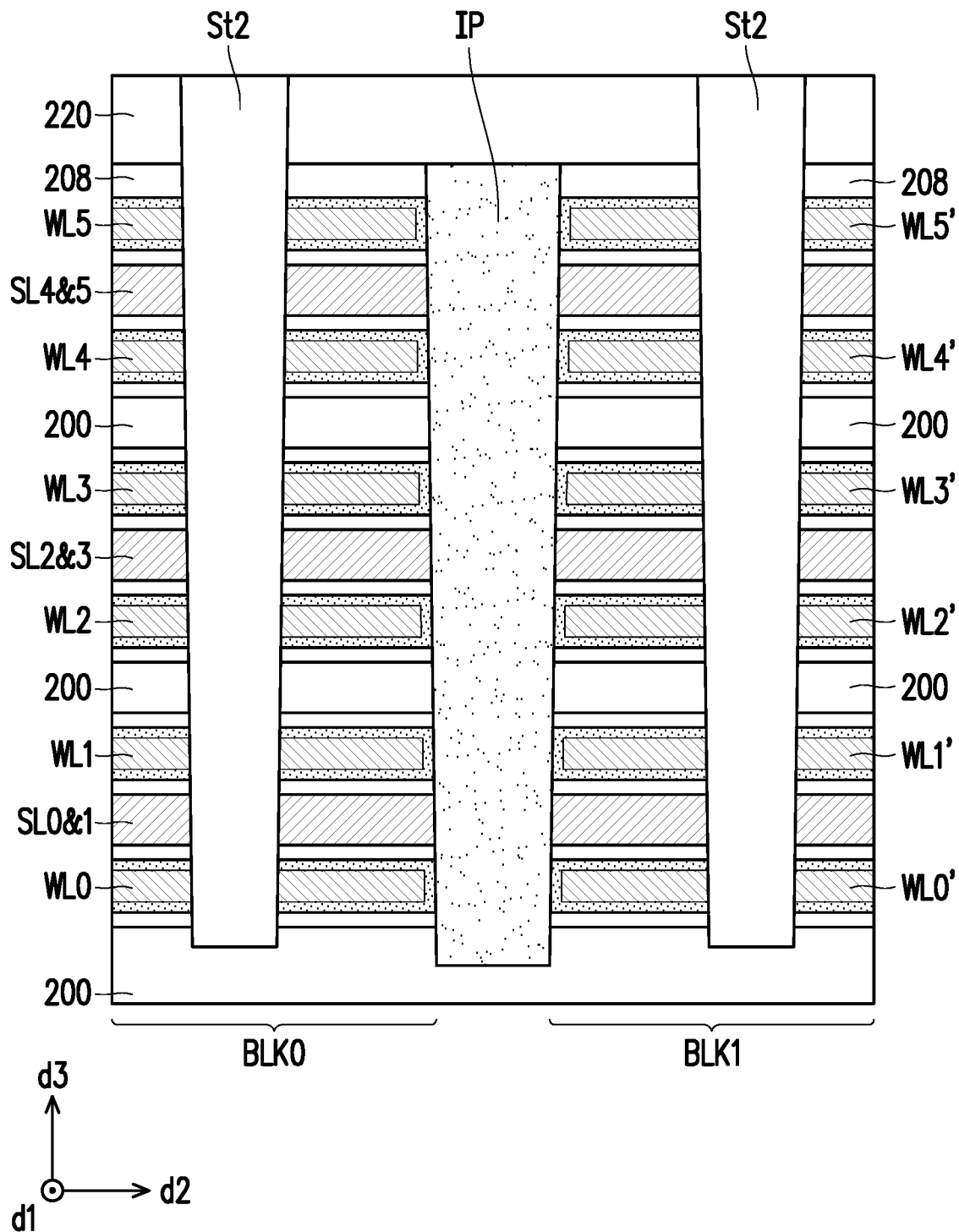

FIG. 3B, FIG. 3C, FIG. 3D respectively illustrate cross-sectional views taken along line B-B', line C-C', line D-D' of FIG. 1, according to some embodiments of the disclosure. FIG. 3B to FIG. 3D illustrates the isolation of blocks BLK0 and BLK1 in different region of the first region R1.

Referring to FIG. 1, and FIG. 3B to FIG. 3D, in the region R1, the block BLK0 and the block BLK1 are separated by the insulating pillars IP and the insulating structures IS. The insulating structures IS are disposed out of the regions 223 and boarder the insulating pillars. In other words, the insulating structures IS are located in a region defined by sidewalls of adjacent insulating pillars IP and outer sidewalls (or edges) of the circled regions 223. The insulating structures IS includes a plurality of insulating layers 203a and 207a from bottom to up and vertically spaced from each other.

For example, as shown in FIG. 3B and FIG. 3C, a portion of the block BLK0 is separated from a corresponding portion of the block BLK1 by the insulating structure IS therebetween. The insulating layers 203a and 207a of the insulating structure IS are disposed laterally between and separate the word lines WL0-WL5 in block BLK0 and the word lines WL0'-WL5' in block BLK1, respectively. As shown in FIG. 1, FIG. 3B and FIG. 3C, the bit lines BL continuously extending from the block BLK0 to the block BLK1, portions of the bit lines BL are laterally between two adjacent insulating pillars IP and are overlapped with the insulating layers 203a and 207a of the insulating structure IS in vertical direction d3.

Referring to FIG. 3D, another portion of the block BLK0 is separated from another corresponding portion of the block BLK1 by the insulating pillar IP therebetween. The insulating pillar IP penetrates through multiple stacked layers of the memory device 10 and vertically extending from a top surface of a top insulating layer 208 and extends into a bottom dielectric layer 200. FIG. 3D also illustrates the insulating posts St2 disposed in the blocks BLK0 and BLK1. In some embodiments, the insulating posts St2 penetrate through the corresponding blocks, vertically extends form a top surface of a stop layer 220 on the top insulating layer 208 and extend into the bottom dielectric layer 200. The top surfaces of the insulating posts St2 may be higher than the top surface of the insulating pillars IP. In some other embodiments, the insulating pillars IP may also extend into the stop layer 220, and the top surfaces of the insulating pillars IP may be substantially coplanar with the top surfaces of the insulating posts St2. It is noted that, the insulating posts St2 does not serve as isolation for separating different blocks.

Figure 3E:
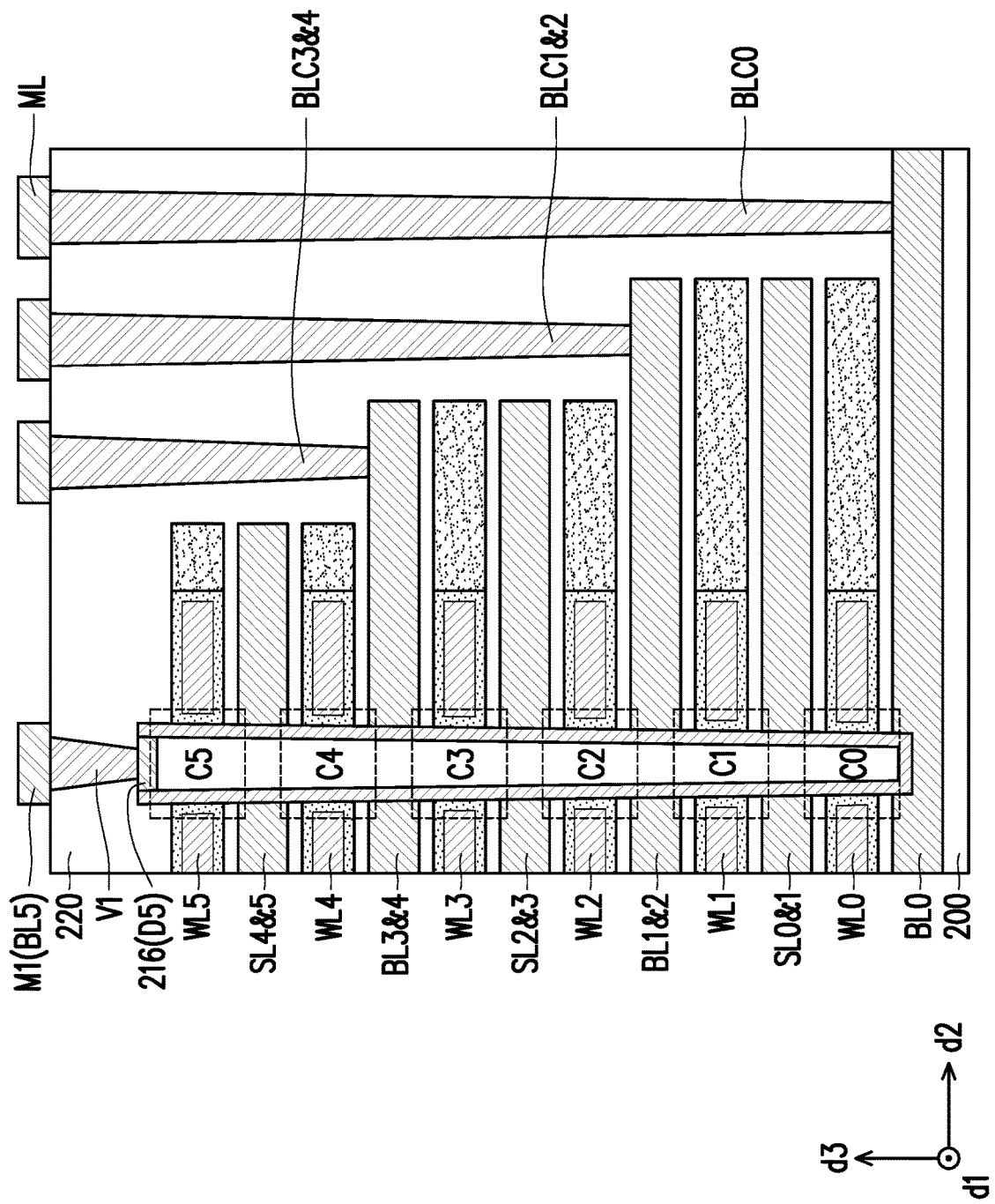

Referring to FIG. 1 and FIG. 3E which is a cross-sectional view taken along line E-E' of FIG. 1, the bit lines BL0, BL1&2, BL3&4 are electrically connected to metal lines ML through bit line contacts BLC0, BLC1&2, BLC3&4, respectively. The ends of the bit lines BL0, BL1&2, BL3&4 may be configured as a stepped shape.

Figure 3F:
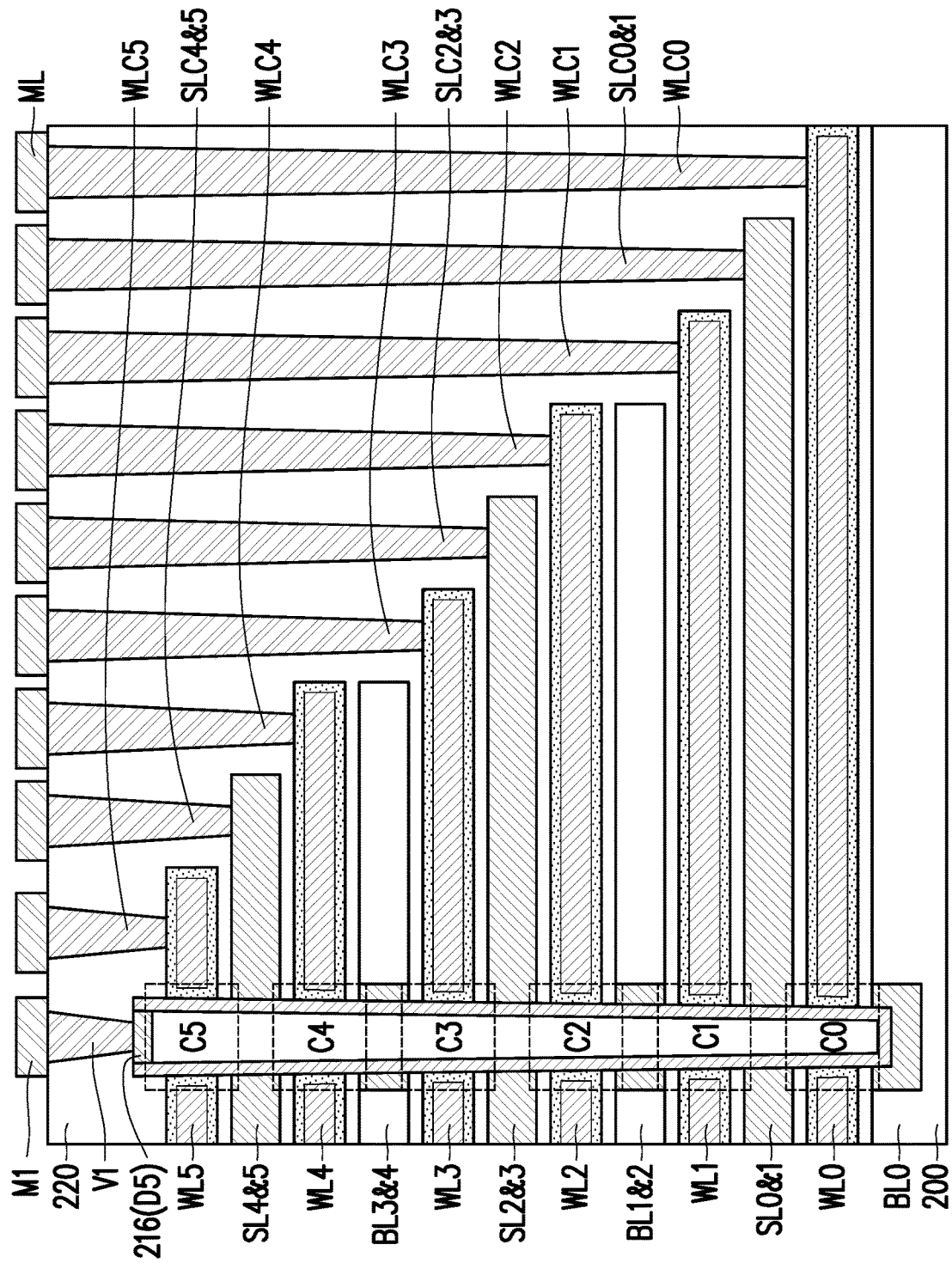

Referring to FIG. 1 and FIG. 3F which is a cross-sectional view taken along line F-F' of FIG. 1, the word lines WL0, WL1, WL2, WL3, WL4, WL5 are connected to metal lines ML through word line contacts WLC0, WLC1, WLC2, WLC3, WLC4, WLC5, respectively. The source lines SL0&1, SL2&3, SL4&5 are connected to metal lines ML through source line contacts SLC0&1, SLC2&3, SLC4&5, respectively. The ends of the word lines WL0-WL5, and the ends of the source line SL0&1, SL2&3, SL4&5 are disposed in a second region R2 of the block BLK0. The ends of the word lines WL0-WL5 and the ends of the source line SL0&1, SL2&3, SL4&5 may be configured in a stepped shape, and the second region R2 is thus referred to as a staircase region. It is noted that, the metal lines ML connected to different contacts are electrically isolated from each other and operated separately.

FIG. 4A to FIG. 4M are schematic cross-sectional views illustrating a method of forming a memory device of FIG. 1 according to some embodiments of the disclosure. FIG. 4A to FIG. 4E and FIG. 4H to FIG. 4M are cross-section views taken along A-A' line of FIG. 1 illustrating various stages in the manufacturing of the memory device, while FIG. 4F and FIG. 4G are cross-sectional views taken along I-I' line of FIG. 1 illustrating various stages in the manufacturing of the memory device.

Figure 4A:
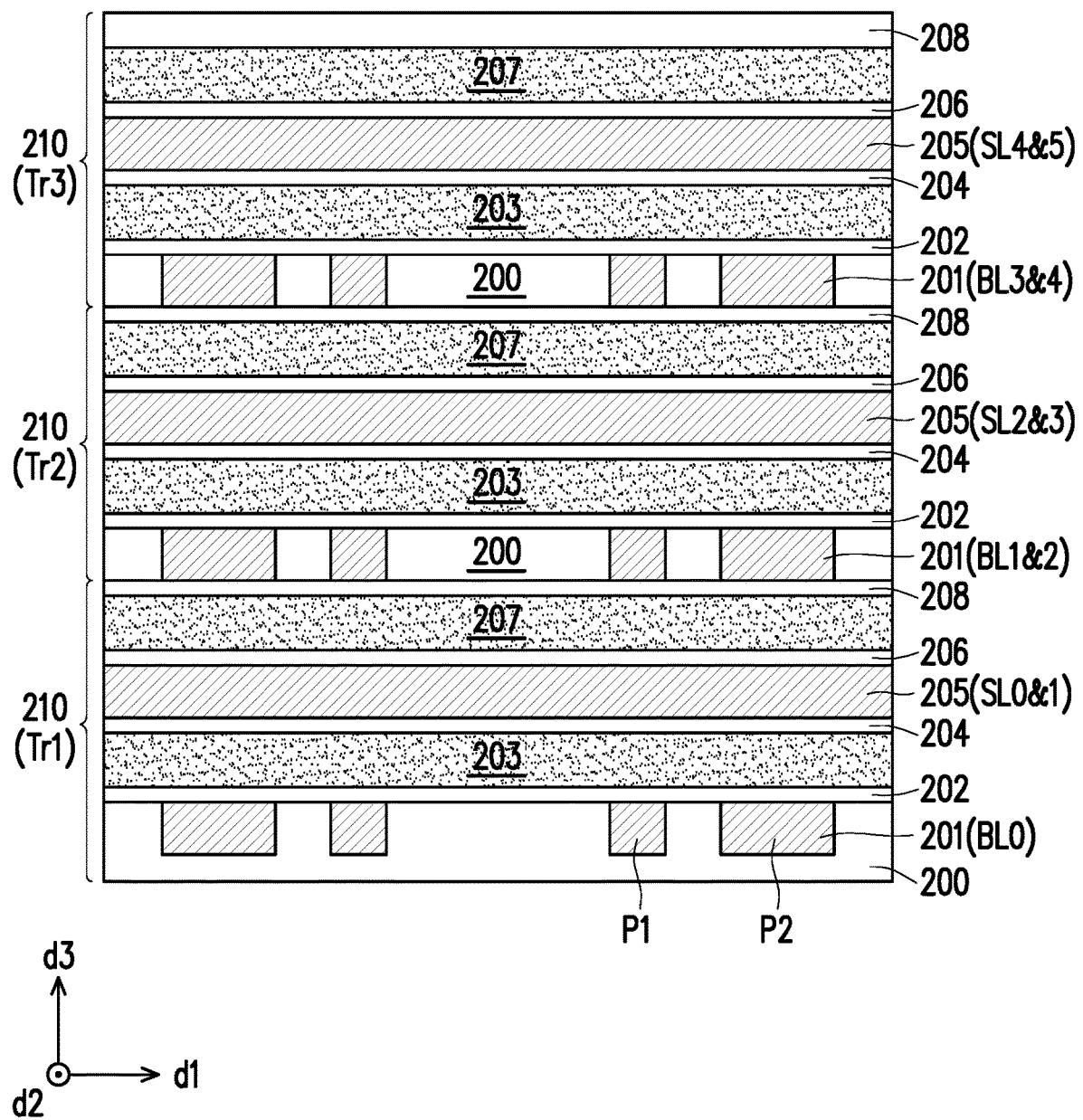
FIG. 4A to FIG. 4M are schematic cross-sectional views illustrating a method of forming a memory device according to some embodiments of the disclosure.

Referring to FIG. 4A, a stack structure 210 is formed over a substrate (not shown), and the formation of the stack structure 210 may be repeated for a plurality of times, such that a plurality of stack structures 210 are formed over the substrate. In an example, the formation of the stack structure 210 is repeated for three times, and three tiers (e.g., tiers Tr1, Tr2, Tr3) of stack structures 210 are formed for forming six vertically stacked memory cells in subsequent processes. However, the disclosure is not limited thereto, the formation of stack structure 210 may be repeated for any suitable number of times to form stack structures in any suitable number of tiers, depending on the number of memory cells need to be stacked. In some embodiments, the formation of the stack structure 210 may be repeated for 2-10 times or more than 10 times, that is, the tiers of the stack structures 210 may range from 2-10 or more than 10. Each tier of the stack structures 210 may be used for forming two vertically stacked memory cells in subsequent processes.

In some embodiments, each stack structure 210 includes a dielectric layer 200 and conductive lines 201 embedded in the dielectric layer 200, an insulating layer 202, a sacrificial layer 203, an insulating layer 204, a conductive layer 205, an insulating layer 206, a sacrificial layer 207 and an insulating layer 208. The formation of each stack structure 210 may include the following processes. A dielectric layer 200 is formed over the substrate (not shown). The substrate may include a semiconductor substrate, such as a silicon substrate. The dielectric layer 200 may include an oxide, such as silicon oxide formed through a suitable deposition process such as chemical vapor deposition (CVD). In some embodiments, a plurality of conductive lines 201 are formed in the dielectric layer 200. The conductive lines 201 are extending in the direction d2 (FIG. 1) and laterally spaced from each other by the dielectric layer 200. In the embodiments of the disclosure, the conductive lines 201 serve as bit lines (i.e., drains). For example, the conductive lines 201 in the first tier Tr1 of the stack structure 210 serve as the bit lines BL0, the conductive lines 201 in the second tier Tr2 of the stack structure 210 serve as the bit lines BL1&2, and the conductive lines 201 in the third tier Tr3 of the stack structure 210 serve as the bit lines BL3&4.

Referring to FIG. 1 and FIG. 4A, each conductive line 201 may be formed to include a body portion P1 and protrusions P2 laterally protrude from sidewalls of the body portion P1. In some embodiments, the conductive lines 201 are formed by firstly patterning the dielectric layer 200 to form bit line trenches in the dielectric layer 200. The bit line trenches have shapes corresponding to the shapes of the bit lines. Thereafter, a conductive material such as doped polysilicon is formed on the dielectric layer 200 and fills into the bit line trenches by suitable deposition process such as CVD. A planarization process such as chemical mechanic polishing (CMP) process is then performed to remove excess portions of the conductive material over the dielectric layer 200, remaining the conductive material within the bit line trenches to form the conductive lines 201. In alternative embodiments, the conductive lines 201 may be formed by firstly forming a conductive material layer over a dielectric layer or an insulating layer, the conductive material layer is then patterned into the conductive lines 201 each of which include a body portion P1 and protrusions P2. The patterning of the conductive material layer may include photolithograph and etching processes. Afterwards, a dielectric material is formed to cover the conductive lines 201, a planarization process is then performed to remove excess portions of the dielectric material over the top surfaces of the conductive lines 201, and the remained dielectric material forms the dielectric layer 200. In some embodiments, the top surfaces of the conductive lines 201 are substantially coplanar with the top surface corresponding dielectric layer 200.

The dielectric layer 200 of the first tier Tr1 of stack structure 210 may be referred to as a bottom (or bottommost) dielectric layer. In some embodiments, the bottom dielectric layer 200 has a bottom surface lower than a bottom surface of the conductive line 201. In the first tier Tr1 of the stack structure 210, the bottom dielectric layer 200 may include a first dielectric layer (not shown) and a second dielectric layer (not shown) on the first dielectric layer, and the bottom conductive lines 201 may be disposed on the first dielectric layer and embedded in the second dielectric layer. The bottom surface of the bottom conductive line 201 may be substantially coplanar with the bottom surface of the second dielectric layer. In the second tier Tr2 and third tier Tr3 of the stack structures 210, the bottom surfaces of the conductive lines 201 may be substantially coplanar with the bottom surface of the dielectric layer 200.

After the dielectric layer 200 and the conductive line 201 are formed, the insulating layer 202, the sacrificial layer 203, and the insulating layer 204 are sequentially formed on the dielectric layer 200 and the conductive line 201 through suitable deposition processes, such as CVD. Each of the insulating layers 202 and 204 may include an oxide, such as silicon oxide. The sacrificial layer 203 includes a material different from materials of the insulating layers 202 and 204. For example, the sacrificial layer 203 includes a nitride such as silicon nitride.

Thereafter, conductive layers 205 are formed on the insulating layer 204. The conductive layers 205 may be embedded in a dielectric layer (not shown). The conductive layer 205 may include a material similar to that of the conductive line 201, such as doped polysilicon. The forming method of the conductive layers 205 may be substantially the same as that of the conductive line 201, which is not described again here. In some embodiments, the conductive layers 205 serve as source lines. For example, the conductive layer 205 of the stack structure 210 in the first tier Tr1 serve as the source line SL0&1, the conductive layer 205 of the stack structure 210 in the second tier Tr2 serves as the source line SL 2&3, and the conductive layer 205 of the stack structure 210 in the third tier Tr3 serves as the source line SL 4&5.

The insulating layer 206, the sacrificial layer 207 and the insulating layer 208 are then formed on the conductive layer 205, sequentially. The materials and forming methods of the insulating layers 206/208 and the sacrificial layer 207 are selected from the same candidate materials and forming methods of the insulating layers 202/204 and the sacrificial layer 203, respectively. The thicknesses of the insulating layers may be the same or different.

Figure 4B:
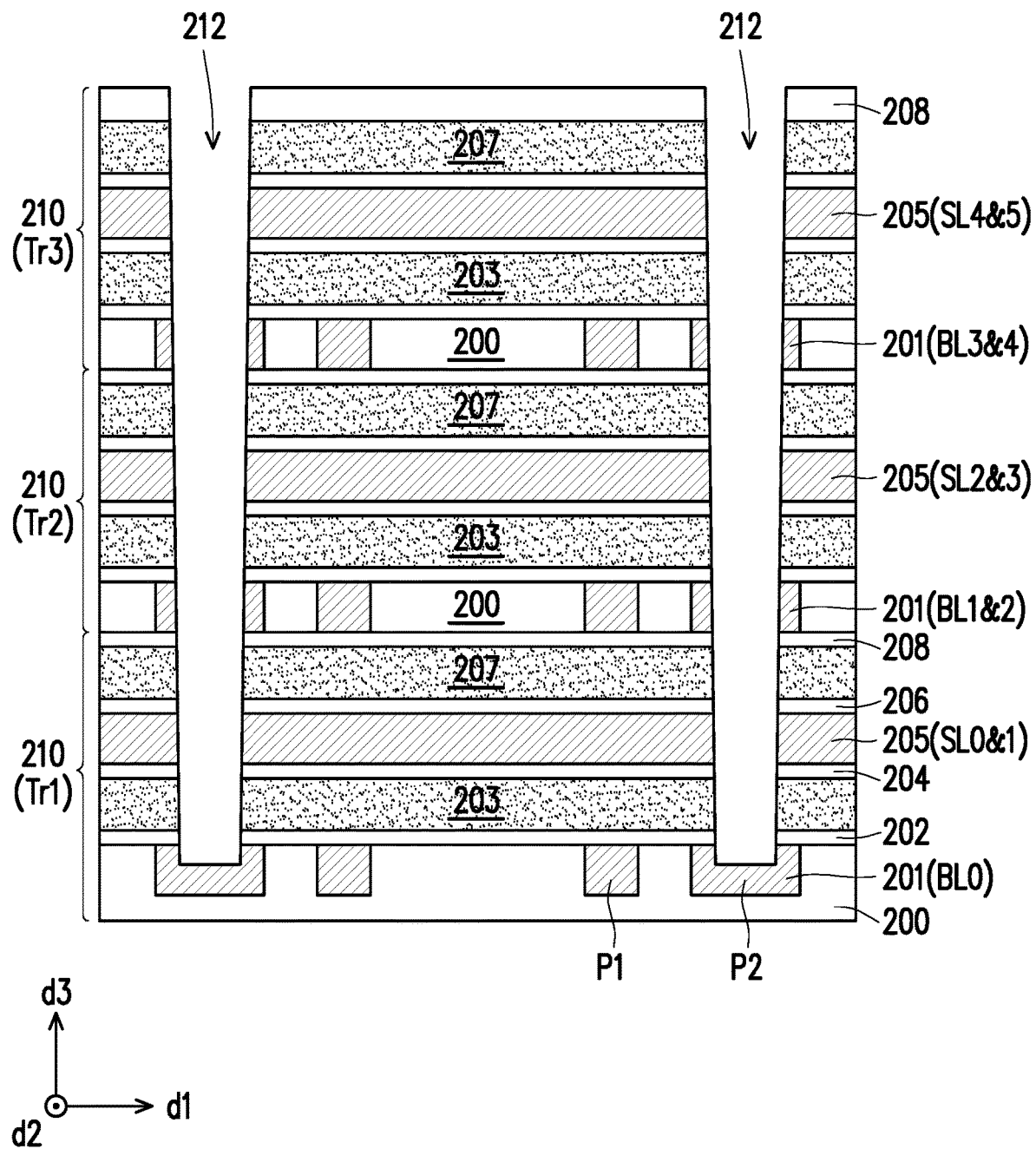

Referring to FIG. 4B, a patterning process is performed to form holes 212 in the stacked structures 210. The hole 212 is used for forming channel pillars and may also be referred to as a memory hole or a channel hole. The patterning process may include photolithograph and etching processes. For example, a patterned mask layer having openings for defining the holes 212 is formed over the topmost tier (e.g., the third tier Tr3) of stack structure 210, and etching process(es) using the patterned mask layer as an etching mask is/are performed to remove portions of the stack structures 210 exposed by the patterned mask, thereby forming the holes 212. The etching process may stop in the bottommost conductive lines 201 (i.e., bottommost bit line BL0). In other words, the hole 212 extends from the top surface of the stack structure 210 at the topmost tier (e.g., Tr3) (i.e., the top surface of top insulting layer 208), completely penetrates through the stack structures 210 (e.g., at the tiers Tr3 and Tr2), partially penetrates through first tier Tr1 of the stack structures 210, and extends into the conductive lines 201 (i.e., bottommost bit line BL0).

In the embodiments of the disclosure, the openings of the patterned mask are disposed directly over the protrusions P2 of the conductive lines 201, such that the resulted hole 212 completely penetrates the protrusions P2 of the conductive lines 201 (i.e., bit lines BL1&2, BL3 &4) of the stack structures 210 at the third and second tiers Tr3 and Tr2, and partially penetrates through the protrusions P2 of the conductive line 201 of the stack structure 210 at the first tier Tr1. The bottom surface of the hole 212 is defined by a surface of bit line BL0, and may be at a level height between the bottom surface and the topmost surface of the bit line BL0. The width of the hole 212 is formed to be less than the width of the protrusion P2 of the conductive line 201, such that a portion of the hole 212 penetrating through the conductive line 201 is formed within the conductive line 201, and the subsequently formed channel layer within the hole 212 can be surrounded by and electrically coupled to the conductive line 201 (i.e., bit lines).

Figure 4C:
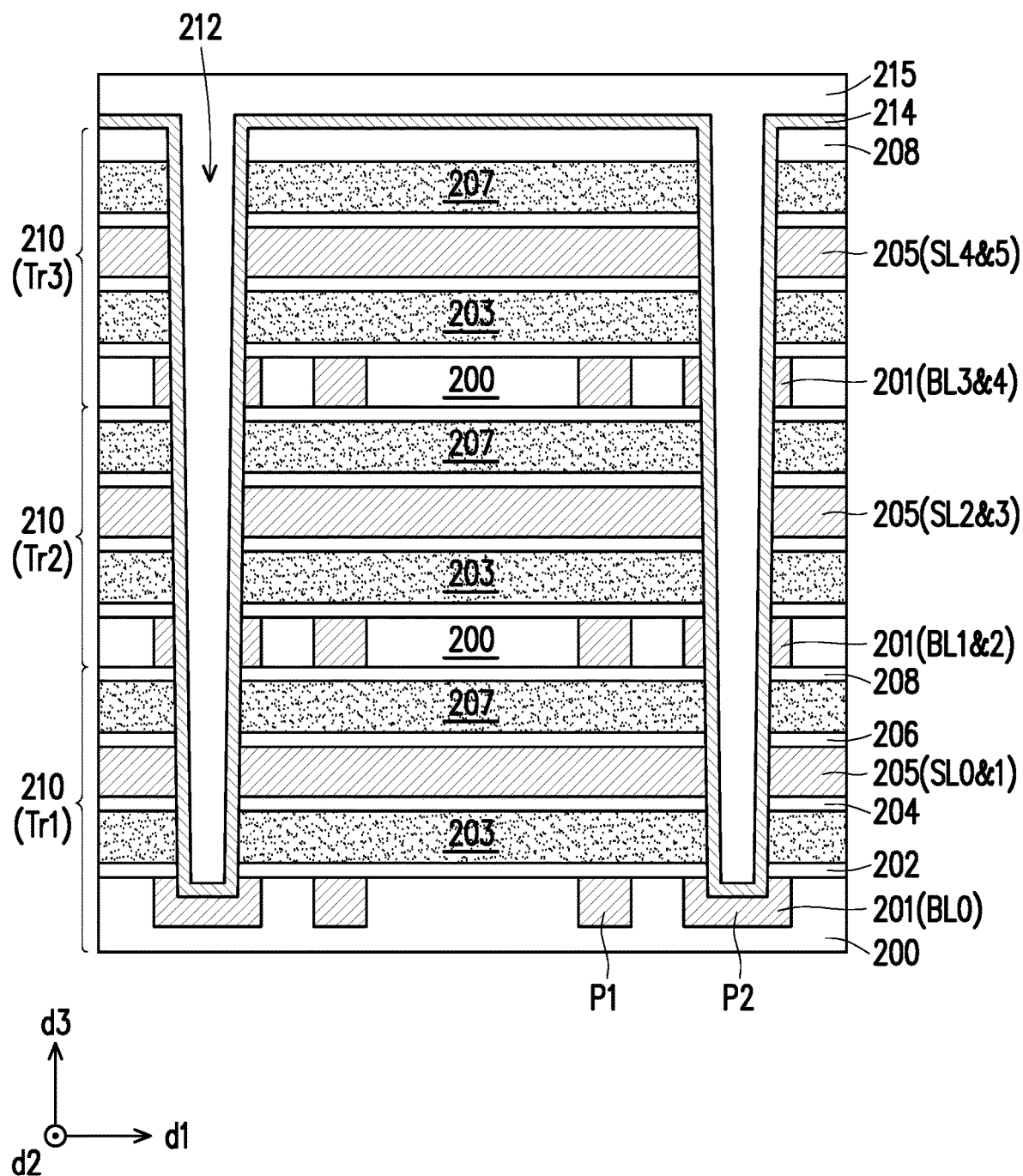
Figure 4D:
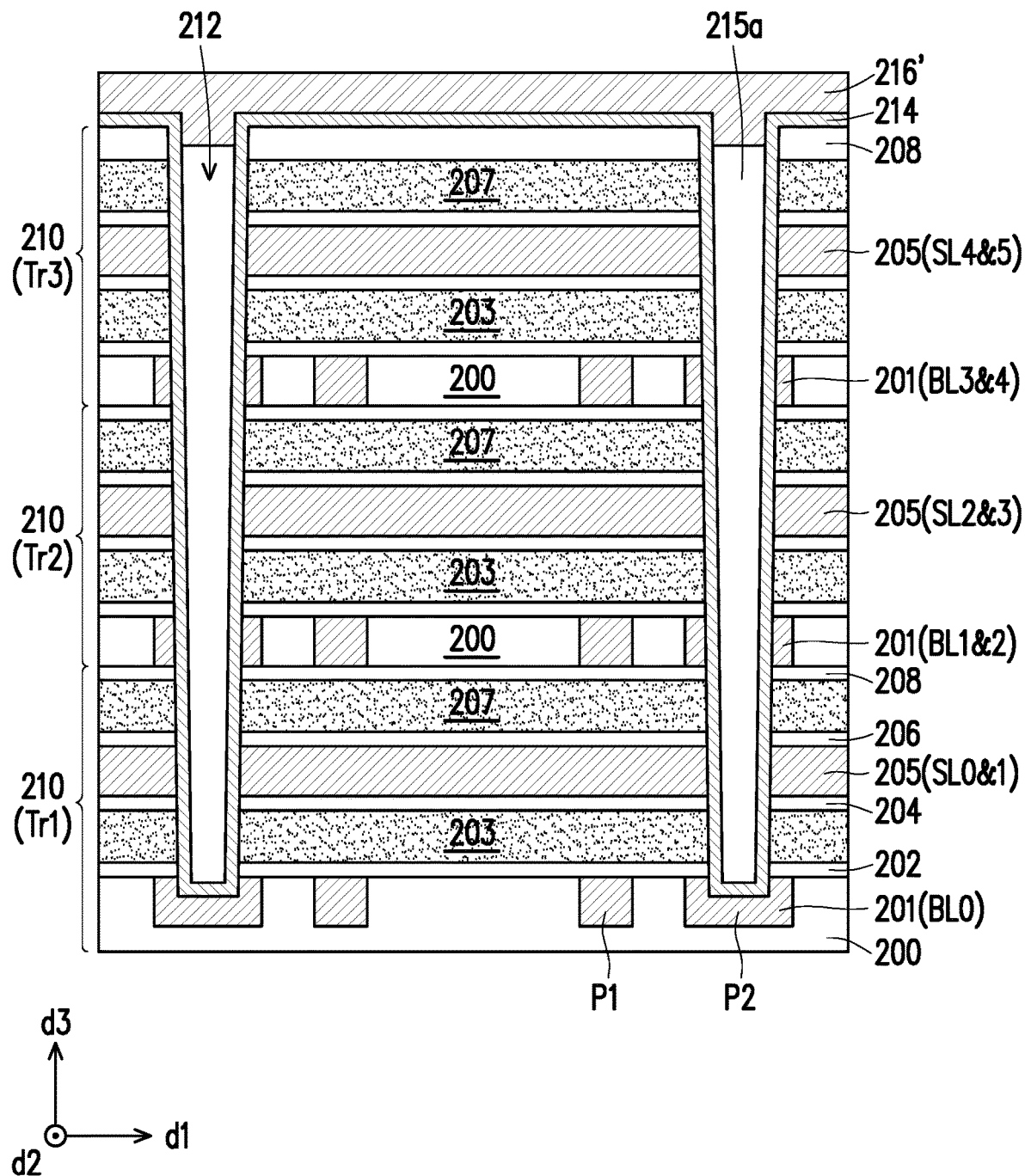
Figure 4E:
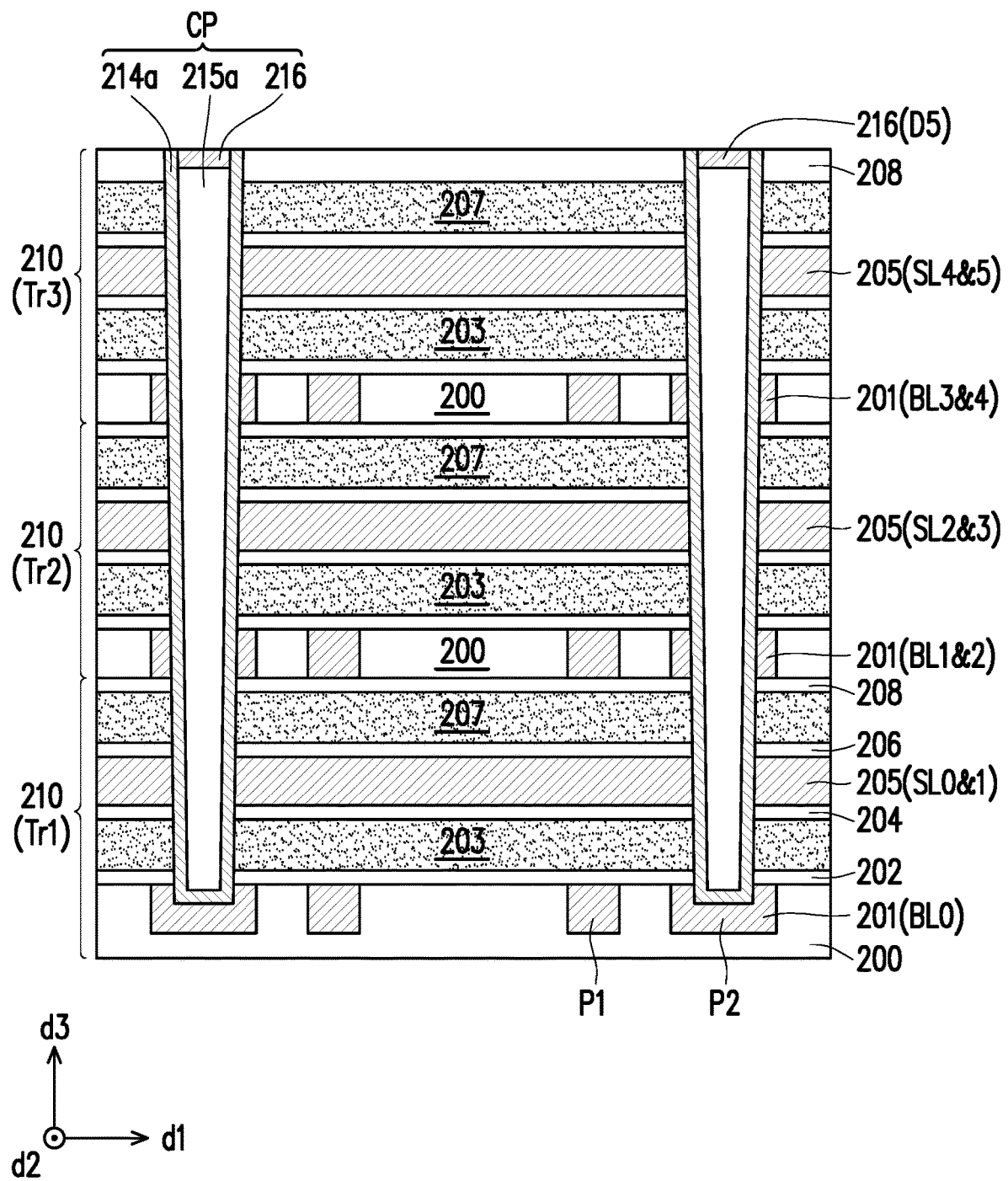
Figure 4F:
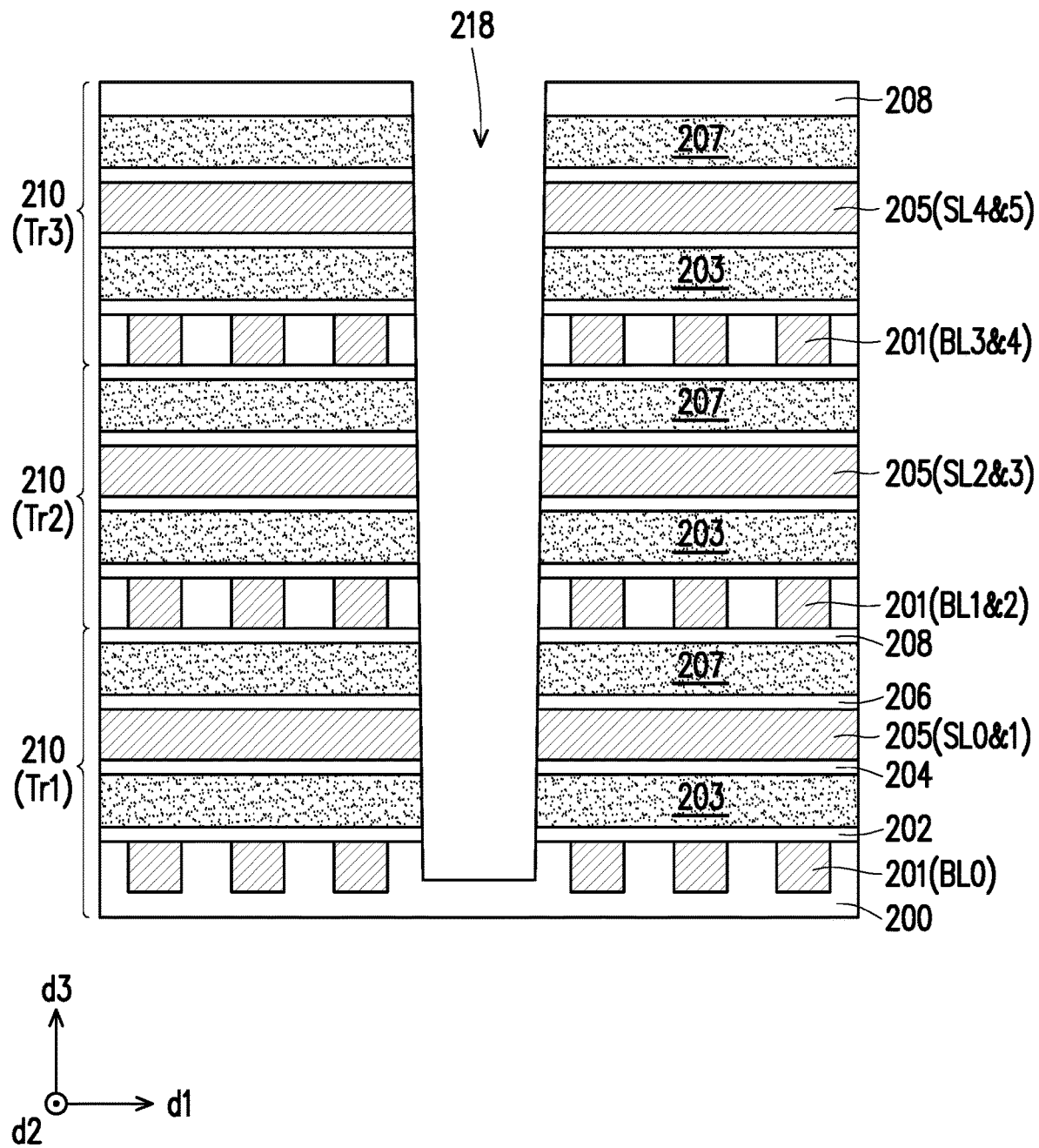
Figure 4G:
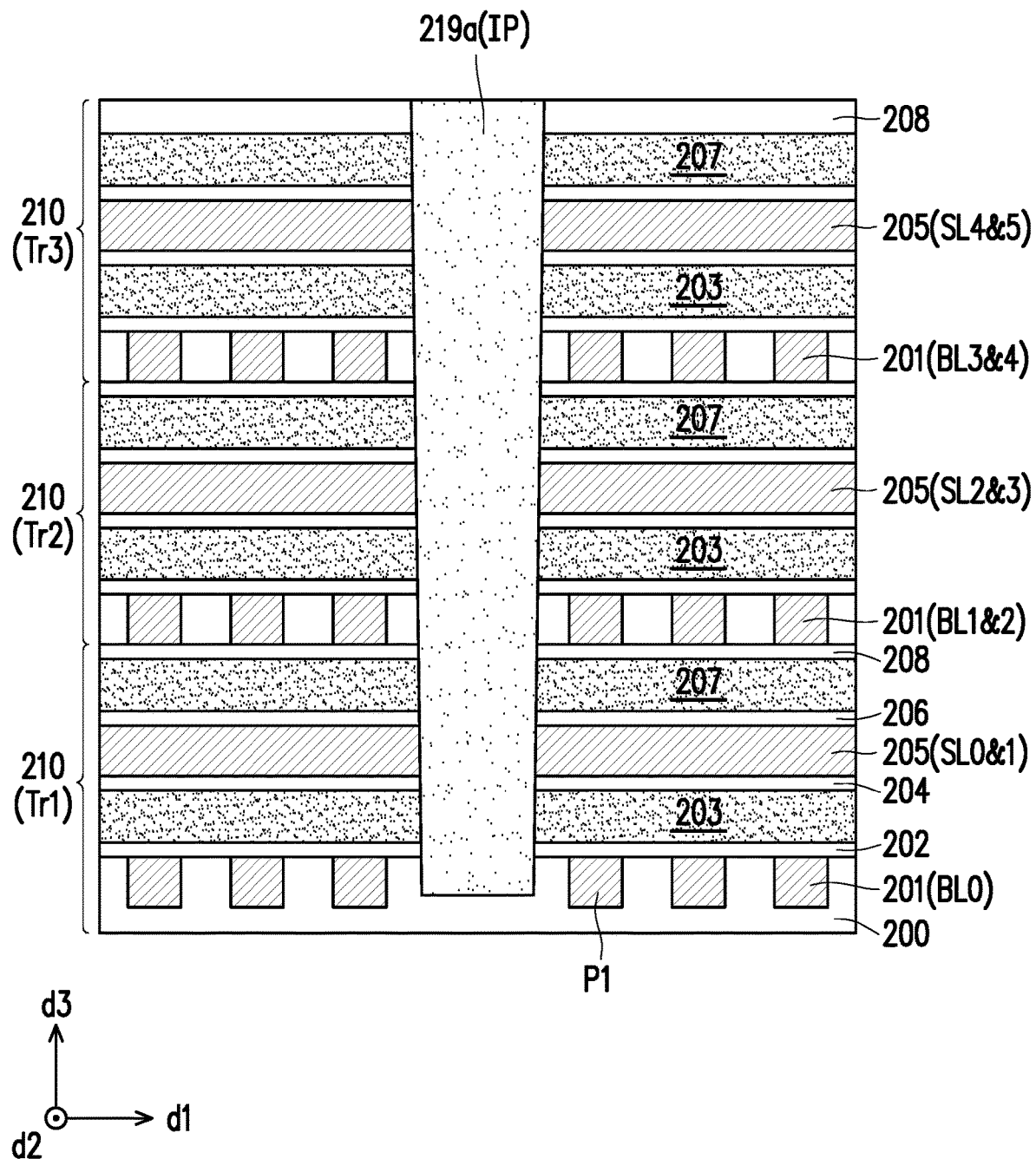

Referring to FIGS. 4C to 4E, a process for forming channel pillars CP in the holes 212 is performed. In some embodiments, a method for forming the channel pillar CP includes following steps. First, as shown in FIG. 4C, a channel layer 214 and an insulating material 215 are formed on the stack structures 210 and fills into the holes 212. The channel layer 214 conformally covers the top surface of the third tier Tr3 of stack structure 210, sidewalls of the stack structures 210 and a top surface of the bit line BL0 defining the holes 212. The channel layer 214 includes a doped semiconductor material, an undoped semiconductor material, or a combination thereof. For example, the channel layer 214 may be formed by firstly performing a chemical vapor deposition process or a physical vapor deposition (PVD) process to form an undoped polysilicon layer, and then performing an annealing process to complete the fabrication of the channel layer 214. The insulating material 215 covers the channel layer 214 and fills the hole 138. The insulating material 215 includes, for example, silicon oxide, silicon nitride, silicon oxynitride, other suitable dielectric materials or a combination thereof formed through CVD.

Referring to FIG. 4C and FIG. 4D, a portion of the insulating material 215 is removed to form an insulating core 215a within the hole 212. The removal process may include a single-stage etching process, a two-stage etching process, a multi-stage etching process, a chemical mechanical polishing process, or combinations thereof. The etching process may include, for example, anisotropic etching, isotropic etching, or combinations thereof. A top surface of the insulating core 215a is formed to be lower than the top surface of the topmost tier (e.g., Tr3) of stack structure 210, and therefore, a groove (not shown) is formed on the top surface of the insulating core 215a. Then, a conductive layer 216' is formed on the stack structures 210 and in the groove above the insulating core 215a. The conductive layer 216' includes, for example, doped polysilicon, tungsten, platinum, or a combination thereof formed through a suitable deposition process such as CVD or PVD.

Referring to FIG. 4D and FIG. 4E, a planarization process is performed to remove excess portions of the conductive layer 216' and channel layer 214 over the topmost surface of the stack structures 210, so as to form a conductive plug 216 within the groove, and a channel layer 214a within the hole 212. The planarization process may include an etch-back process or a chemical mechanical polishing process. The channel layer 214a, the insulating core 215a and the conductive plug 216 constitute a channel pillar CP. The channel layer 214a surrounds sidewalls of the conductive plug 216, sidewalls and bottom surface of the insulating core 215a. The channel layer 214a is in contact with and electrically coupled to the conductive plug 216, the conductive lines 201 (bit lines), and the conductive layers 205 (source lines). In some embodiments, the conductive plug 216 is used as a drain D5 of a subsequently formed top memory cell.

Referring to FIG. 1, FIG. 4F and FIG. 4G, processes for forming insulating pillars 219a and dummy pillars 219b are then performed. In some embodiments, a plurality of openings 218 are formed in the stack structures 210 within the first and second regions R1 and R2, by a patterning process including photolithograph and etching processes. The openings 218 include trenches, holes, or combinations thereof. In some embodiments, the opening 218 vertically extends from the top surface of the top stack structure 210 into the bottommost dielectric layer 200. An insulating material (not shown) is formed on the stack structures 210 and filling into the openings 218. The insulating material may include an oxide, such as silicon oxide formed through a suitable deposition process, such as CVD. A planarization process is then performed to remove excess portions of the insulating material over the topmost surface of the stack structures 210, and the insulating material remained within the openings 218 form the insulating pillars 219a and dummy pillars 219b (FIG. 1).

In the embodiments of the disclosure, the insulating pillars 219a (i.e., insulating pillars IP) are disposed within the first region R1 and primarily serve as a portion of an isolation structure for isolating two adjacent blocks, while the dummy pillars 219b serves as a supporting structure for providing structural support in the subsequent process to avoid collapse of layers or the structure. It is appreciated that, the insulating pillars 219a also have the function of providing structural support. In some embodiments, most of the dummy pillars 219b are disposed within the second region R2, and some of the dummy pillars 219b may also be disposed within the first region R1. It is noted that, the location of the dummy pillars 219b shown in FIG. 1 is merely for illustration, and the disclosure is not limited thereto. The dummy pillars 219b may be disposed in any suitable location where structural support is needed. In some embodiments, when viewed from a top view or a plan view, the shape of the insulating pillar 219a may be strip-shaped, square, rectangle, circular, oval, or any other suitable shape, the shape of the dummy pillars 219*b* may be square, rectangle, circular, oval, or any other suitable shape.

Figure 4H:
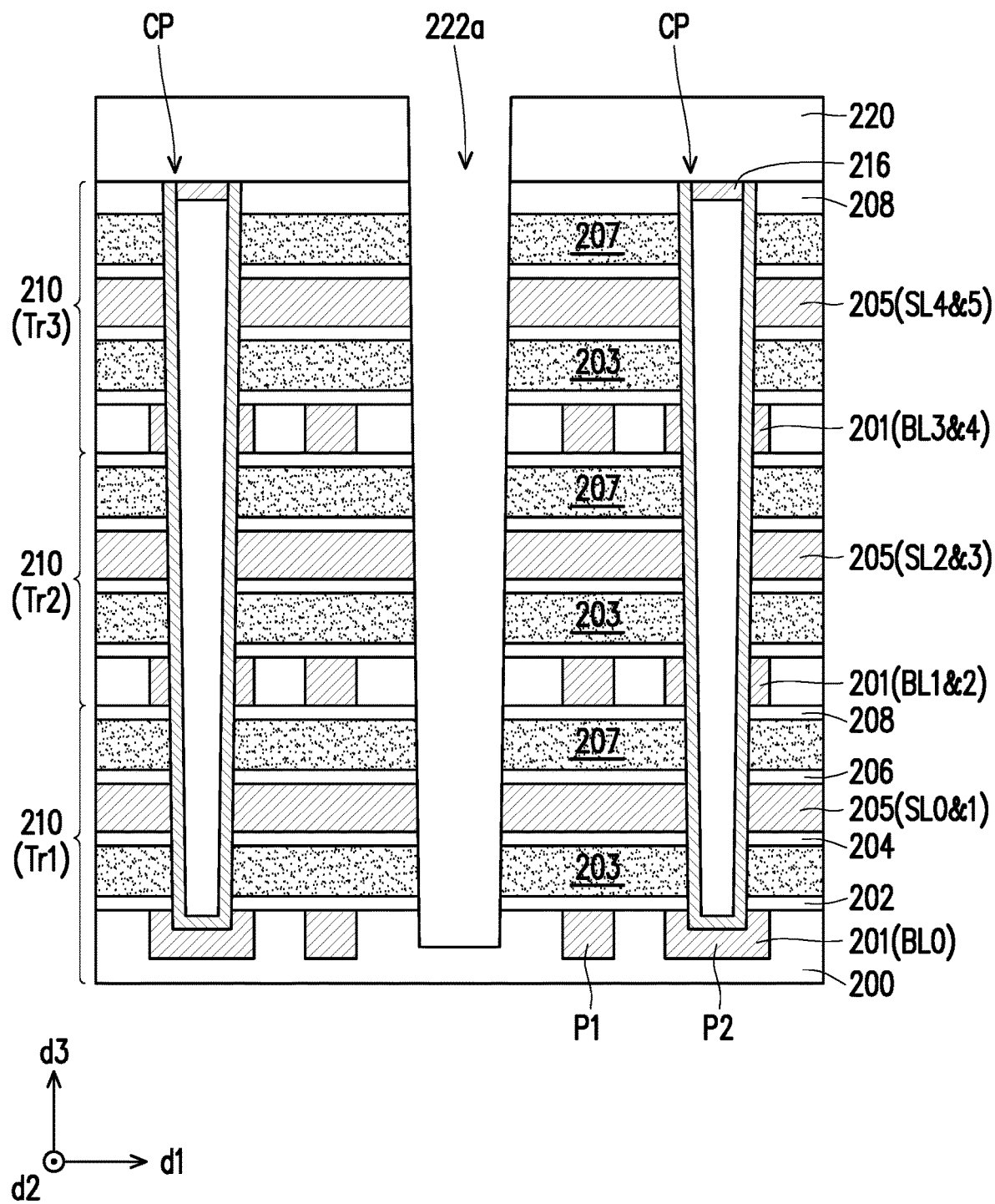

Referring to FIG. 1 and FIG. 4H, a stop layer 220 is formed on the stack structures 210. The stop layer 220 may includes silicon oxide, silicon nitride, silicon oxynitride, silicon carbide, or a combination thereof formed by CVD. In some embodiments, the stop layer 220 includes a material different from the material of the topmost insulating layer 208. In the illustrated embodiment, the stop layer 220 is formed after forming and thus covers the insulating pillars 219*a* and dummy pillars 219*b*, but the disclosure is not limited thereto. In alternative embodiments (not shown), the stop layer 220 may be formed before forming the openings 218 (FIG. 4F) and the pillars 219*a*/219*b* (FIG. 4G). For example, after the stop layer 220 is formed on the top insulating layer 208, the opening 218 is formed extending through the stop layer 220 and the stack structures 210, and the insulating pillars 219*a* and dummy pillars 219*b* are then formed in the openings 218. In such embodiments, the insulating pillars 219*a* and dummy pillars 219*b* may vertically extend from a top surface of the stop layer 220 and into the bottom dielectric layer 200 of the stack structures 210.

Still referring to FIG. 1 and FIG. 4H, after the insulating pillars 219*a* and dummy pillars 219*b* are formed, a plurality of slit holes 222*a* and slit trenches 222*b* are formed in the stop layer 220 and the stack structures 210. The slit holes 222*a* may extend from the top surface of the stop layer 220, penetrate through the third and second tiers of stack structures 210, partially penetrate through the first tier of stack structure 210 and extends into the bottommost dielectric layer 200. In the embodiments of the disclosure, the slit holes 222*a* are formed within the first region R1 and may be disposed between two adjacent insulating pillars IP in the direction d2, and the slit trenches 222*b* are formed within the second region R2. The shapes of the slit holes 222*a* in top view may be circular, oval, square, rectangle, or the like, or any other suitable shape, or combinations thereof. The top view of slit trenches 222*b* may be strip shaped and extend along the direction d1. The slit trench 222*b* may be disposed to board the insulating pillar IP and expose a sidewall of the insulating pillar IP.

Figure 4I:
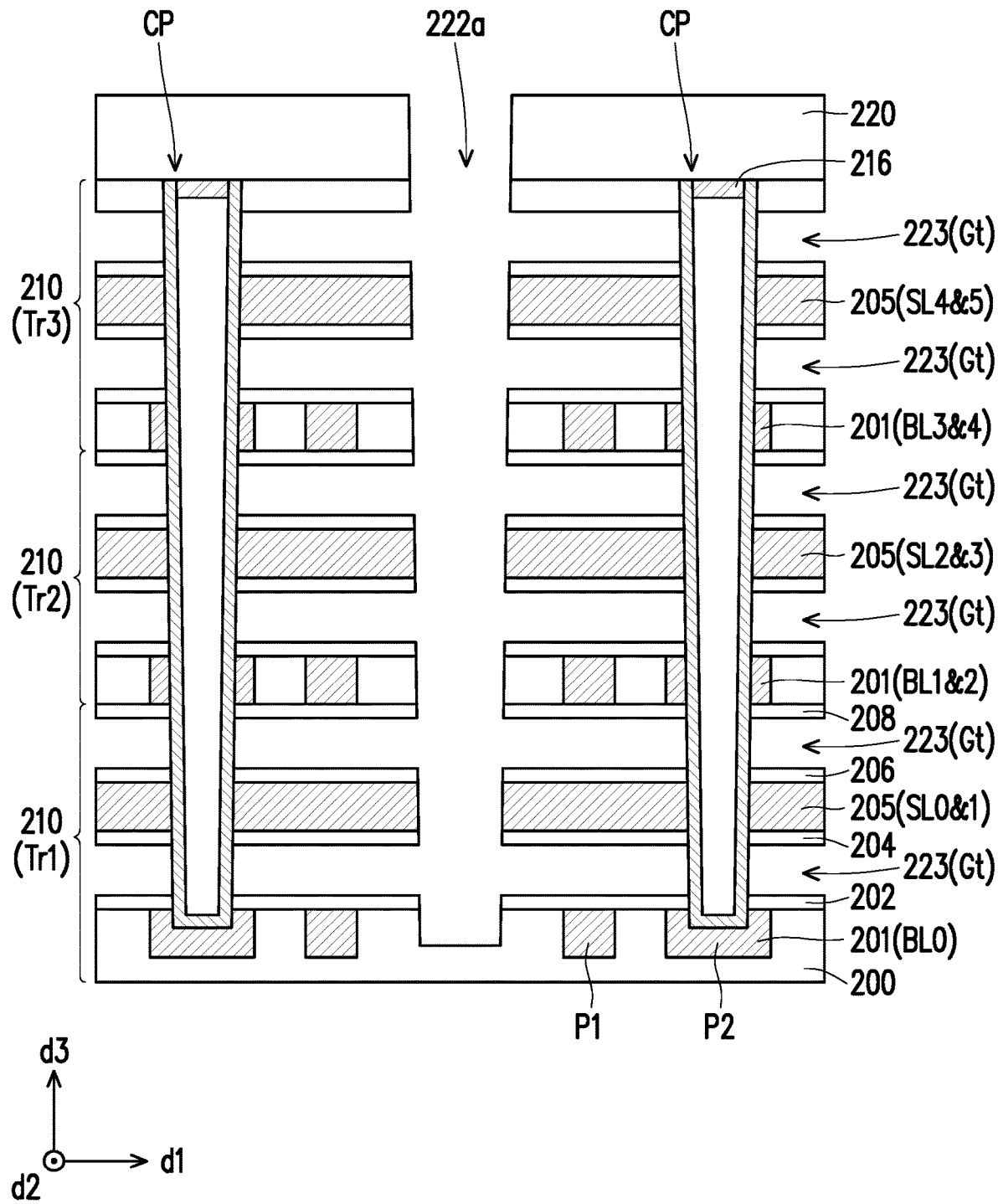

Referring to FIG. 1 and FIG. 4I, a lateral etching process is performed to remove portions of the sacrificial layers 203/207 (FIG. 4H) exposed by the slit holes 222*a* to form gate trenches Gt. The etching process may include dry etching, wet etching, or a combination thereof. In the embodiments in which the sacrificial layers 203/207 include silicon nitride, phosphoric acid may be used as an etchant of the etching process. In some embodiments, the regions of the removed sacrificial layers 203/207 are shown as the regions 223 circled in dotted line in FIG. 1. In other words, the gate trenches Gt are formed at the regions 223 previously occupied by the removed sacrificial layers 203/207. The regions 223 may also be referred to as the removed regions (or removal range) of the sacrificial layers 203/207. In some embodiments, the removal range 223 of the sacrificial layers 203/207 (i.e., the region of the gate trenches Gt) spread out from the slit holes 222*a*. In other words, each slit hole 222*a* corresponds to or partially defines a removal range of the sacrificial layer 203/207. The removal range of the sacrificial layers 203/207 may further be controlled by controlling the duration of the etching process, such that the removal ranges 223 of the sacrificial layers 203/207 corresponding to adjacent slit holes 222*a* in a same block intersect each other, while the removal ranges 223 of the sacrificial layers 203/207 corresponding to slit holes 222*a* in different blocks do not interest and are separated from each other. In other words, the gate trenches Gt in the same block are formed to be in spatial communication with each other, while the gate trenches Gt in different blocks are not in spatial communication with each other and may be separated from each other by the unmoved sacrificial layers 203*a*/207*a* and/or the insulating pillar IP therebetween.

In some embodiments, when viewed in the plan view FIG. 1, the removal ranges 223 of the sacrificial layers 203/207 is circular shaped and may be concentric to the corresponding slit hole 222*a*, but the disclosure is not limited thereto. The removal ranges 223 of the sacrificial layers 203/207 may be in any suitable shape, as long as the removal ranges 223 of the sacrificial layers 203/207 in the same block intersect each other, and the removal ranges 223 of the sacrificial layers 203/207 in different blocks do not intersect each other. During the process for forming the gate trenches Gt, the dummy pillars 219*b* and/or the insulating pillars 219*a* provide structural support in the process to avoid collapse of layers or the structure.

In some embodiments, the sacrificial layers 203*a*/207*a* outside the circled removal regions 223 are not removed, and portions of the unremoved sacrificial layers 203*a*/207*a* are located within in the first region R1 and between different blocks, such as the block BLK0 and BLK1. The said portions of the unremoved sacrificial layers 203*a*/207*a* may also be referred to as insulating layers 203*a*/207*a*. The insulating layers 203*a*/207*a* are in contact with the insulating pillars IP and constitute the isolation structure together with the insulating pillars IP for isolating the blocks BLK0 and BLK1 in the first region R1. The combination of the insulating layers 203*a*/207*a* may also be referred to as an insulating structure IS (FIG. 1 & FIG. 3B). In other words, as shown in FIG. 1 and FIG. 3B, the insulating structure IS includes a plurality of insulating layers 203*a*/207*a* which are vertically spaced from each other. In some embodiments, as shown in FIG. 1, within the region R1, the unremoved sacrificial layers (i.e., insulating layers) 203*a*/207*a* may be located in a region outside the circled regions 223 and between insulating pillars IP, and the region (or the top view of the insulating layer) may be hexagon-shaped, rhombus-like shaped, star-like shaped, or the like, but the disclosure is not limited thereto.

Figure 4J:
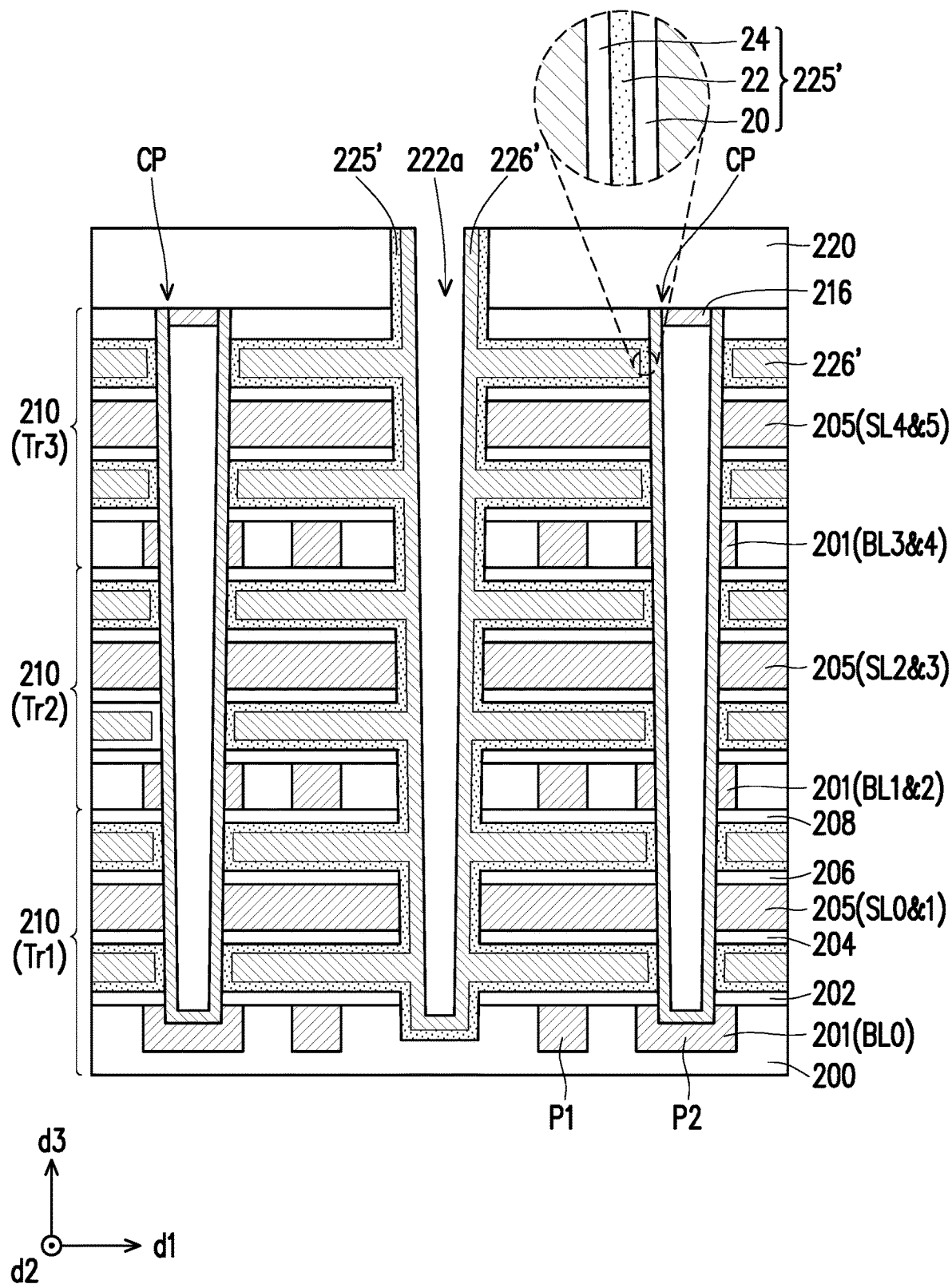

Referring to FIG. 4J, a charge storage structure 225' and a conductive layer 226 are formed in the gate trenches Gt and lining a sidewall of the slit hole 222*a* (and/or a sidewall of the slit trench 222*b*). The charge storage structure 225' and the conductive layer 226 may further cover (not shown) the top surface of the stop layer 220. In an embodiment, the charge storage structure 225' may include a tunneling layer 20, a charge storage layer 22 and a blocking layer 24. The tunneling layer 20/the charge storage layer 22/the blocking layer 24 is, for example, a composite layer of oxide/nitride/oxide (ONO), or a composite layer formed by other materials. The charge storage structure 225' may also be, for example, a composite layer of oxide/nitride/oxide/nitride/oxide (ONONO), a composite layer of silicon/oxide/nitride/oxide/silicon (SONOS), a composite layer of aluminum oxide/oxide/nitride/oxide ($Al_2O_3$/O/N/O) or other suitable composite layers. The charge storage structure 225' may be formed by processes such as CVD, thermal oxidation, nitridation, etching, etc. The conductive layer 226' may include a conductive material such as doped polysilicon, amorphous silicon, tungsten (W), cobalt (Co), aluminum (Al), tungsten silicide (WSix), or cobalt silicide (CoSix) formed through CVD or PVD.

Figure 4K:
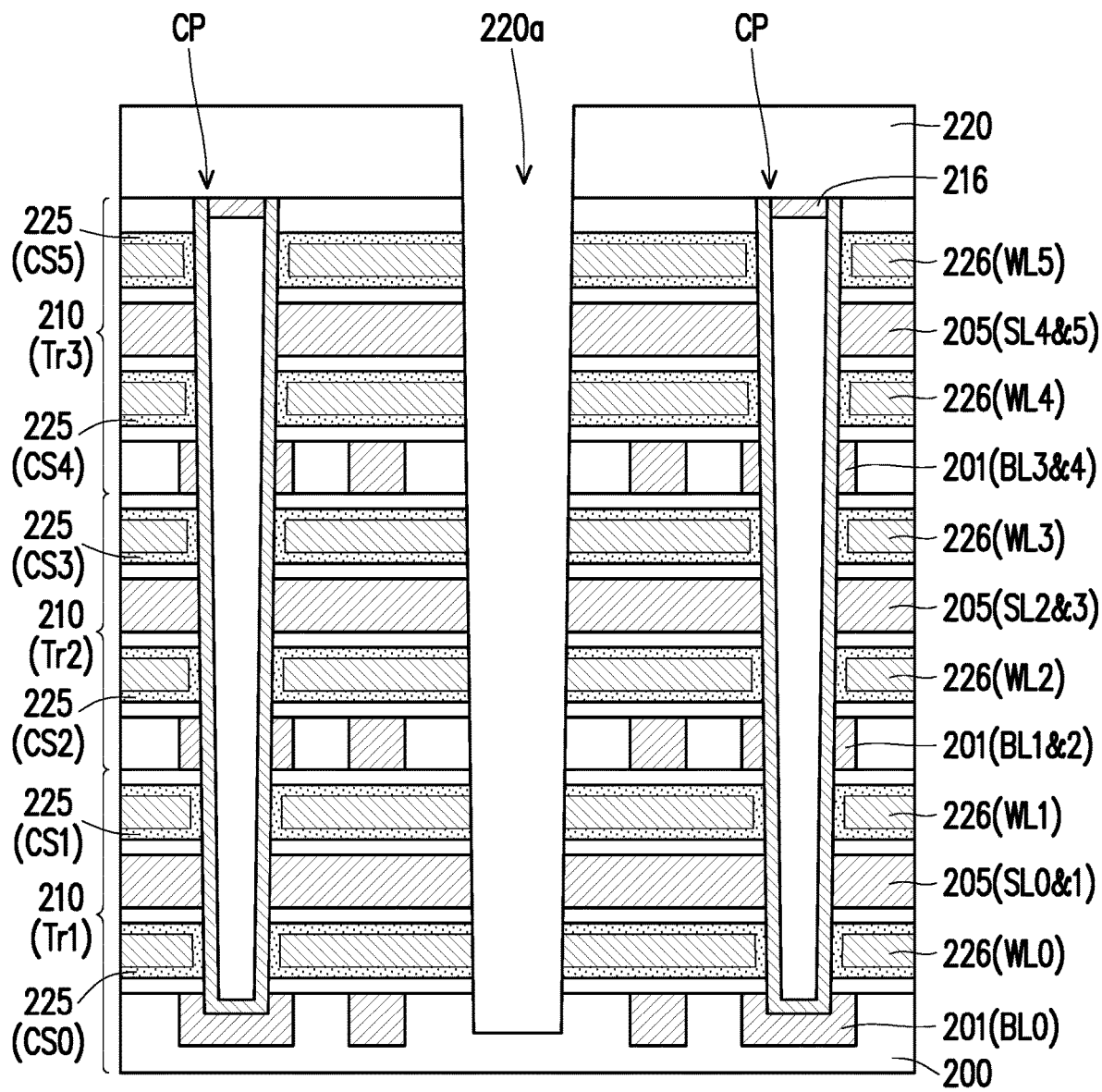

Referring to FIG. 4K, an anisotropic etching process is performed to remove portions of the conductive layer 226' and the charge storage structure 225' covering the top surface of the stop layer 220 and in the slit hole 222a (and/or slit trench 222b), remaining conductive layers 226 and charge storage structures 225 in the gate trenches Gt. The conductive layers 226 serve as word lines WL0-WL5 (i.e., gate G0-G5) for different memory cells from bottom to up, respectively. The charge storage structures 225 serves as charge storage structures CS0-CS5 for different memory cells from bottom to up, respectively. Each of the charge storage structures 225 covers the top surface and the bottom surface of the corresponding conductive layer 226 and is sandwiched between the sidewall of the corresponding conductive layer 226 and the outer sidewall of the channel pillar CP.

Figure 4L:
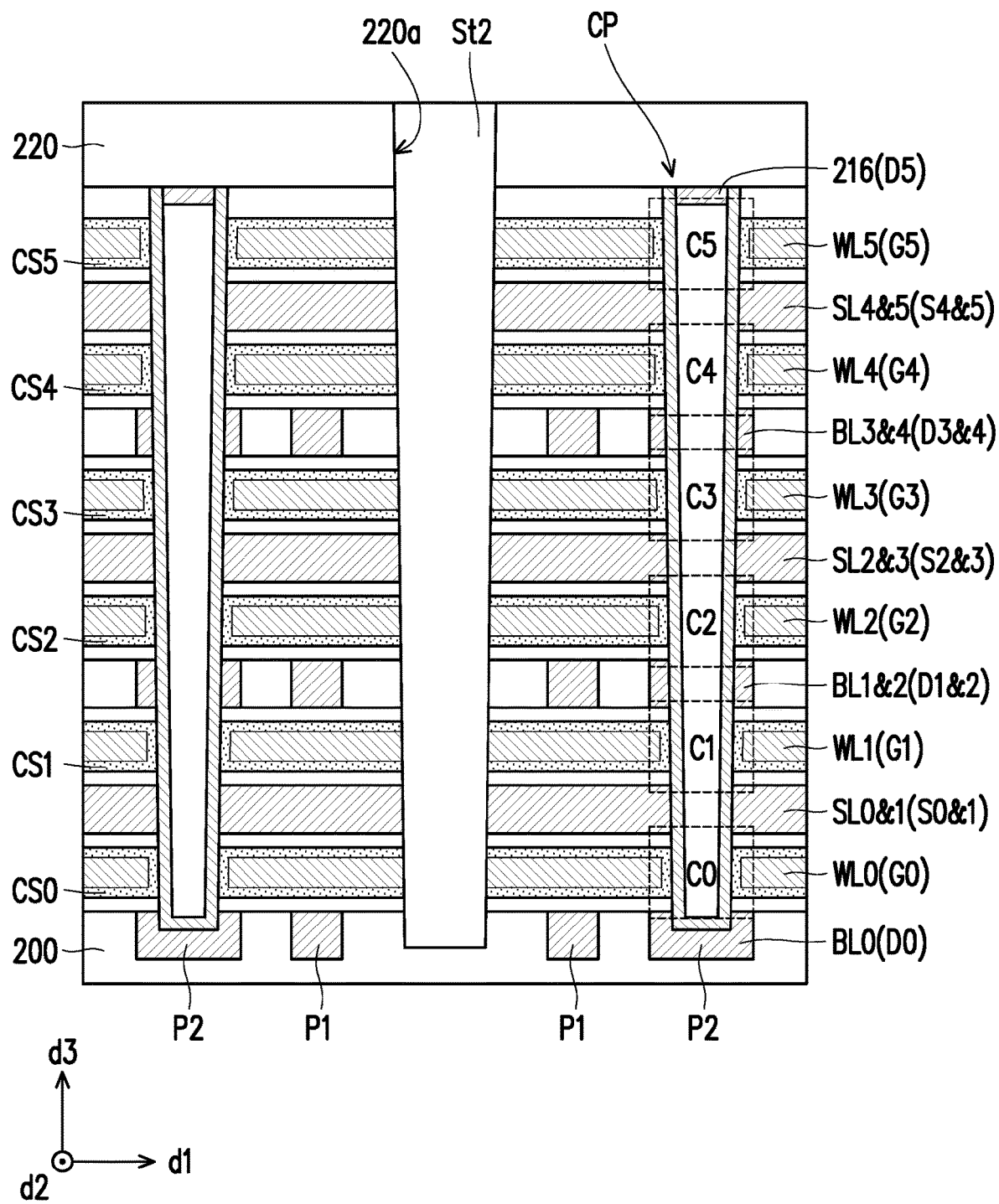

Referring to FIG. 1 and FIG. 4L, an insulating material is formed to fill the slit holes 222a and the slit trenches 222b, thereby forming a plurality of insulating posts St2 in the slit holes 222a and insulating walls St1 in the slit trenches 222b. A method for forming the insulating posts St2 and the insulating walls St1 may include the following processes. An insulating material is formed on the stop layer 220 and fills into the slit holes 222a and slit trenches 222b. The insulating material may include, for example silicon oxide, spin-on glass, and may be formed by CVD or spin coating process. Thereafter, a planarization process is performed to remove excess portions of the insulating material over the top surface of the stop layer 220, the remained insulating materials within the slit holes 222a form the insulating posts St2, and the remained insulating materials within the slit trenches 222b form the insulating walls St1. The planarization process may include an etching back process or a CMP process, during which the stop layer 220 may be used as an etching stop layer or a polishing stop layer. In some embodiments, the top surfaces of the insulating posts St2 and the top surfaces of the insulating walls St1 may be substantially coplanar with the top surface of the stop layer 220.

Figure 4M:
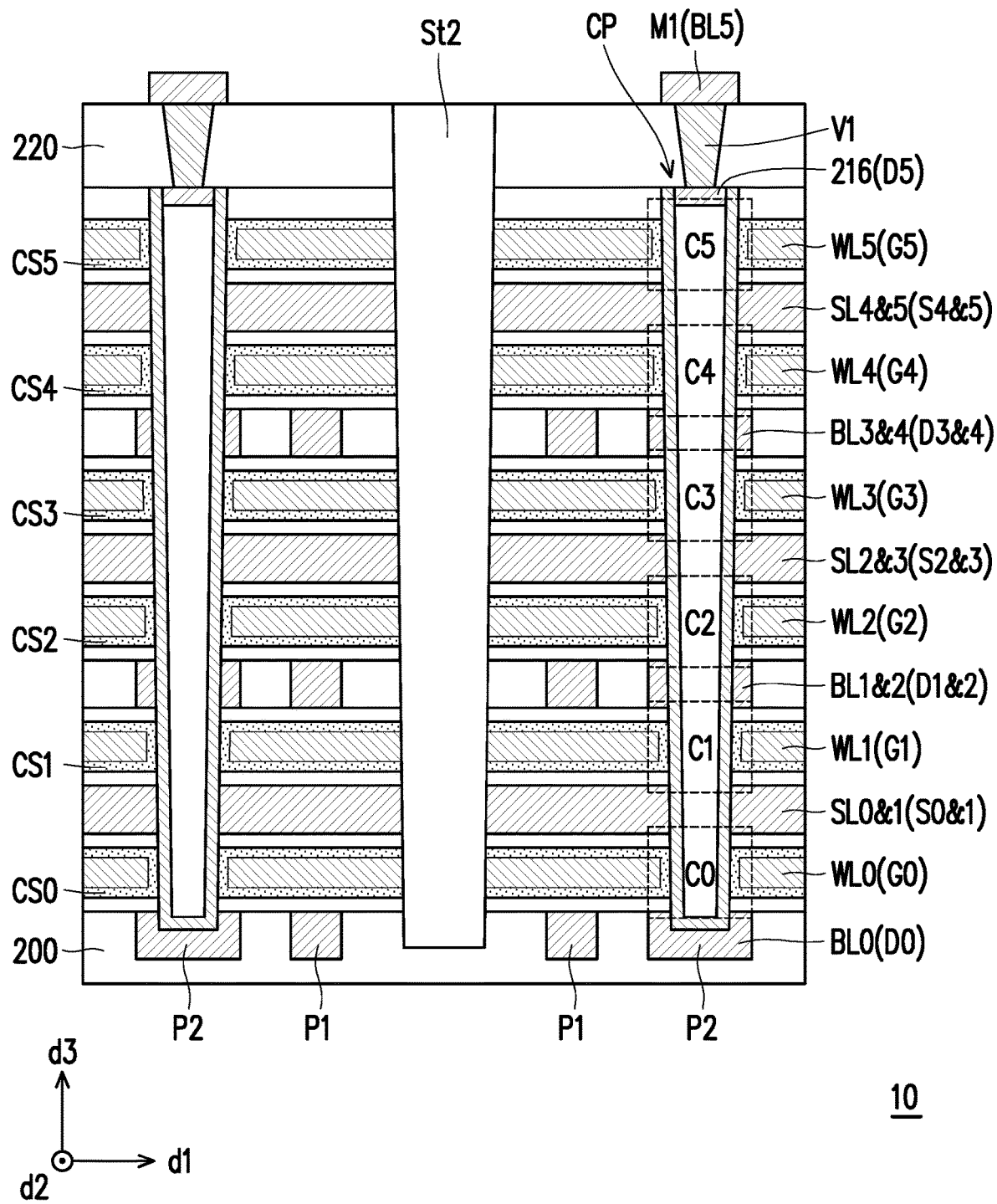

Referring to FIG. 4M, conductive vias V1 are formed in the stop layer 220 and electrically connected to the conductive plugs 216, conductive lines M1 are formed on the conductive vias V1 to electrically connect to the conductive plugs 216 through the conductive vias V1. The conductive vias V1 and the conductive lines M1 may include a suitable conductive material such as doped polysilicon, amorphous silicon, tungsten (W), cobalt (Co), aluminum (Al), tungsten silicide (WSix), or cobalt silicide (CoSix) and may be formed by suitable deposition process (e.g., CVD, PVD) and/or plating processes.

In some embodiments, the memory device 10 is thus formed. In the embodiments in which three tiers of stack structure 210 are initially formed, six memory cells C0-C5 are formed in the memory device 10. As shown in FIG. 4M, the gate G0 (i.e., a portion of the word line WL0), the source S0&1 (i.e., a portion of the source line SL0&1), the drain D0 (i.e., a portion of the bit line BL0), a portion of the charge storage structure CS0 and a portion of the channel pillar CP constitute the memory cell C0. The gate G1 (i.e., a portion of the word line WL1), the source S0&1 (i.e., a portion of the source line SL0&1), the drain D1&2 (i.e., a portion of the bit line BL1&2) a portion of the charge storage structure CS1, and a portion of the channel pillar CP constitute the memory cell C1. The gate G2 (i.e., a portion of the word line WL2), the source S2&3 (i.e., a portion of the source line SL2&3), the drain D1&2 (i.e., a portion of the bit line BL1&2), a portion of the charge storage structure CS2, and a portion of the channel pillar CP constitute the memory cell C2. The gate G3 (i.e., a portion of the word line WL3), the source S2&3 (i.e., a portion of the source line SL2&3), the drain D3&4 (i.e., a portion of the bit line BL3&4), a portion of the charge storage structure CS3, and a portion of the channel pillar CP constitute the memory cell C3. The gate G4 (i.e., a portion of the word line WL4), the source S4&5 (i.e., a portion of the source line SL4&5), the drain D3&4 (i.e., a portion of the bit line BL3&4), the a portion of the charge storage structure CS4, and a portion of the channel pillar CP constitute the memory cell C4. The gate G5 (i.e., a portion of the word line WL5), the source S4&5 (i.e., a portion of the source line SL4&5), the drain D5 (i.e., the conductive plug 216), a portion of the charge storage structure CS4, and a portion of the channel pillar CP constitute the memory cell C5.

Figure 5A:
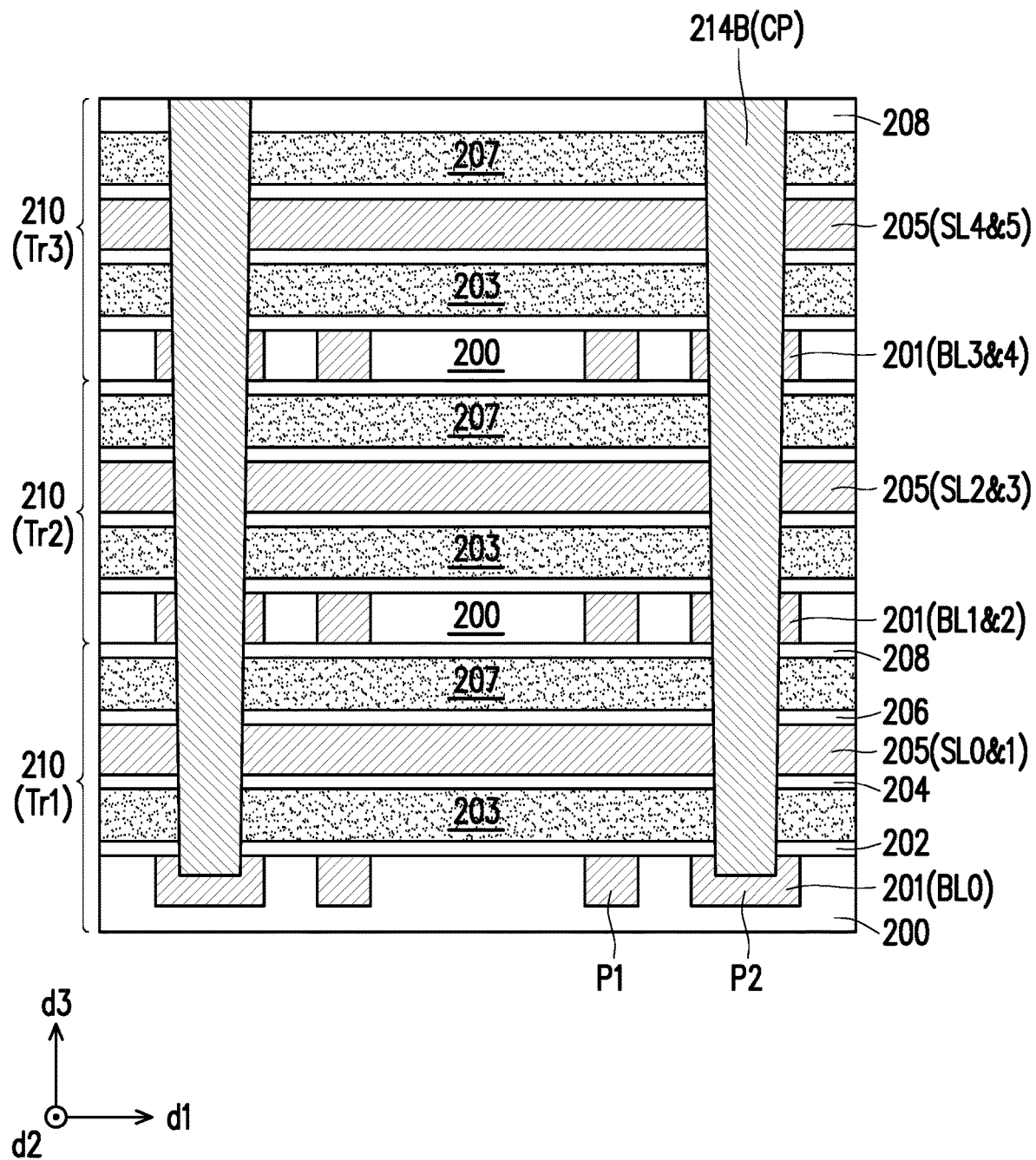
FIG. 5A and FIG. 5B illustrates schematic cross-sectional views of a partial fabrication process of a memory device according to some other embodiments of the disclosure.
Figure 5B:
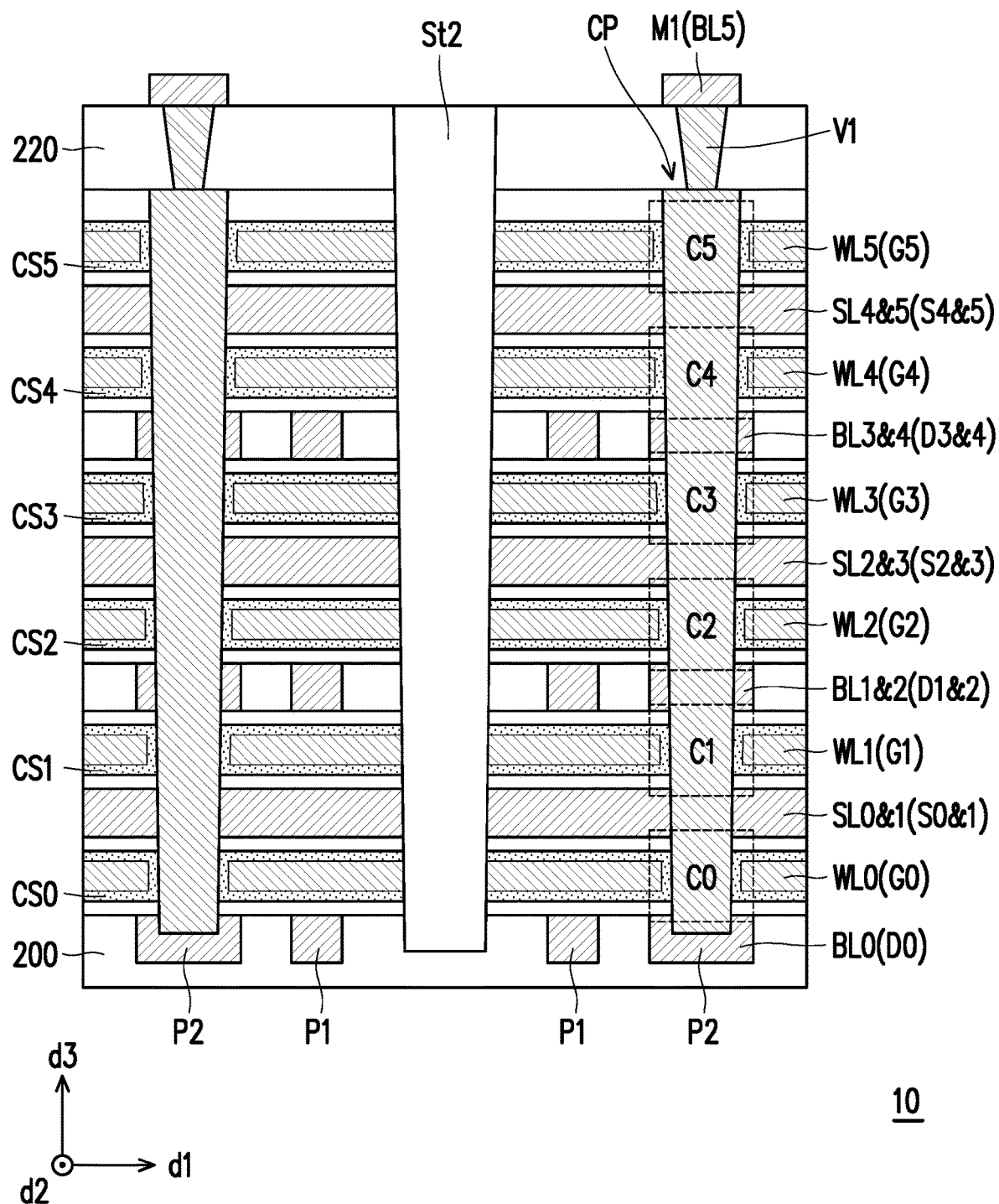

In the aforementioned embodiment, the channel pillar CP includes the channel layer 214a, the insulating core 215a and the conductive plug 216. However, the disclosure is not limited thereto. In some other embodiments, the channel pillar CP may also be composed of a solid doped semiconductor pillar 214B, as shown in FIGS. 5A and 5B. Referring to FIG. 4B and FIG. 5A, in some embodiments, after the holes 212 are formed, a doped semiconductor layer is formed on the stack structures 210 and fills up the holes 212. The doped semiconductor layer is, for example, doped epitaxial silicon. Thereafter, a planarization process is performed to remove excess portions of the doped semiconductor layer over the top surface of the stack structures 210, remaining the doped semiconductor pillars 214B within the holes 212. A memory device using the solid doped semiconductor pillar 214B as the channel pillar CP is shown in FIG. 5B. Referring to FIG. 5B, in some embodiments, the portions of the doped semiconductor pillar 214B surrounded by the word lines, bit lines, and source lines serve as the channels of corresponding memory cells, while a top portion of the doped semiconductor pillar 214B may serve as the drain D5 of the topmost memory cell C5.

In the foregoing embodiments, the bit lines of the memory cells underlying the topmost memory cell are formed to have a protrusion laterally protruding from the body portion and the channel pillars are disposed at the position corresponding to the protrusion, such that the protrusion has a larger dimension for channel pillar penetrating through, and the channel pillar can be laterally surrounded by the protrusion and thus electrically connected to the bit line. In other words, the bit lines have a non-uniform width. However, the disclosure is not limited thereto. In some other embodiments, the bit line may be formed to have a uniform width, and the shape and/or dimension of the bit line are not limited in the disclosure, as long as the width of the bit line is larger than the width of the corresponding channel pillar, and the channel pillar penetrating through the bit line can be laterally surrounded by and electrically connected to the bit line.

Although the disclosure has been described with reference to the above embodiments, the disclosure is not limited to the embodiments, it will be apparent to one of ordinary skill in the art that modifications to the described embodiments may be made without departing from the spirit of the disclosure. Accordingly, the scope of the disclosure is defined by the attached claims.

What is claimed is:
1. A memory device, comprising:
a word line;
a bit line and a source line disposed on opposite sides of the word line in a vertical direction;
a channel pillar, penetrating through and connected to the word line, the bit line and the source line;

a charge storage structure, surrounding a top surface and a bottom surface of the word line and laterally sandwiched between the channel pillar and the word line; and a first block and a second block separated from each other by a plurality of insulating pillars and insulating structures alternatively arranged along a first direction, wherein the channel pillar completely penetrates through and is laterally surrounded by the bit line, wherein the bit line includes a body portion and a protrusion laterally protruding from sidewalls of the body portion.

2. The memory device of claim 1, wherein the channel pillar penetrates through the protrusion of the bit line and has a width less than a width of the protrusion.

3. The memory device of claim 1, comprising a plurality of bit line sets arranged parallel in the first direction, and each of the bit line sets includes a plurality of bit lines from bottom to top, which are extending in a second direction and vertically spaced from each other.

4. The memory device of claim 1, further comprising:
a bottommost word line underlying the word line;
a bottommost bit line and a bottommost source line disposed on opposite sides of the bottommost word line in the vertical direction, the bottommost word line, the bottommost bit line and the bottommost source line are connected to the channel pillar;
wherein the channel pillar penetrates through the bottommost source line and the bottommost word line, and partially penetrates through the bottommost bit line.

5. The memory device of claim 4, wherein a bottom surface of the channel pillar is lower than a bottom surface of the bit line and in contact with the bottommost bit line.

6. The memory device of claim 4, wherein the bit line is disposed vertically between the word line and the bottommost word line.

7. The memory device of claim 1, wherein a top portion of the channel pillar serves as a drain of a topmost memory cell of the memory device.

8. The memory device of claim 1, wherein
the bit line continuously extends from the first block to the second block;
a portion of the bit line is between two adjacent insulating pillars of the plurality of insulating pillars; and
one of the insulating structures is disposed laterally between and in contact with the two adjacent insulating pillars.

9. The memory device of claim 8, wherein the one of the insulating structures comprises a plurality of insulating layers separating a first plurality of word lines in the first block and a second plurality of word lines in the second block,
wherein the plurality of insulating layers are vertically separated from each other and overlapped with the portion of the bit line in the vertical direction.

10. The memory device of claim 1, further comprising:
insulating posts disposed in the first block and the second block;
wherein the insulating posts and the plurality of insulating pillars are alternatively arranged in a second direction perpendicular to the first direction and spaced apart from each other.

11. A memory device, comprising:
a word line;
a bit line and a source line disposed on a top side and a bottom side of the word line;
a channel pillar, penetrating through and connected to the word line, the bit line and the source line;
a charge storage structure laterally sandwiched between the channel pillar and the word line; and
an insulating post, laterally surrounded by the word line,
wherein the channel pillar completely penetrates through and is laterally surrounded by the bit line,
wherein the bit line extends along a first direction, and has a first width and a second width in a second direction perpendicular to the first direction, wherein a width of the channel pillar is larger than the first width of the bit line and less than the second width of the bit line.

12. The memory device of claim 11, wherein a bottom surface of the channel pillar is lower than a bottom surface of the bit line.

13. The memory device of claim 11, wherein a portion of the bit line is ring-shaped, and the channel pillar is laterally surrounded by the portion of the bit line.

14. The memory device of claim 11, wherein the word line is disposed in a circled region surrounding the insulating post.

15. The memory device of claim 11, comprising a first block and a second block separated from each other by a plurality of insulating pillars and insulating structures alternatively arranged along the second direction.

16. The memory device of claim 15, wherein the insulating structure comprises a plurality of insulating layers separating a first plurality of word lines in the first block and a second plurality of word lines in the second block,
wherein the plurality of insulating layers are vertically separated from each other and overlapped with the portion of the bit line in a vertical direction.

* * * * *